(12) United States Patent
Chen et al.

(10) Patent No.: US 12,100,627 B2
(45) Date of Patent: Sep. 24, 2024

(54) METHOD AND STRUCTURE FOR METAL GATES

(71) Applicant: TAIWAN SEMICONDUCTOR MANUFACTURING COMPANY LTD., Hsinchu (TW)

(72) Inventors: Tung-Huang Chen, Hsinchu (TW); Yen-Yu Chen, Taichung (TW); Po-An Chen, Taichung (TW); Soon-Kang Huang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/180,139

(22) Filed: Mar. 8, 2023

(65) Prior Publication Data

US 2023/0245931 A1 Aug. 3, 2023

Related U.S. Application Data

(63) Continuation of application No. 17/151,780, filed on Jan. 19, 2021, now Pat. No. 11,605,566.

(51) Int. Cl.
*H01L 21/8238* (2006.01)
*H01L 21/28* (2006.01)
(Continued)

(52) U.S. Cl.
CPC .. *H01L 21/82385* (2013.01); *H01L 21/28088* (2013.01); *H01L 21/28114* (2013.01);
(Continued)

(58) Field of Classification Search
CPC ......... H01L 21/82385; H01L 21/28088; H01L 21/28114; H01L 21/28123; H01L 21/3212;
(Continued)

(56) References Cited

U.S. PATENT DOCUMENTS 11,605,566 B2 * 3/2023 Chen ................ H01L 21/28114
2010/0052058 A1 3/2010 Hsu et al.
(Continued)

FOREIGN PATENT DOCUMENTS

KR 1020150112908 A 10/2015
KR 1020160078210 A 7/2016
(Continued)

OTHER PUBLICATIONS

Notice of Allowance of Patent, Cited References and Translation dated May 30, 2023 issued by the Korean Intellectual Property Office for the Korean Application No. 10-2021-0035863.
(Continued)

*Primary Examiner* — Christine A Enad
(74) *Attorney, Agent, or Firm* — WPAT LAW; Anthony King

(57) ABSTRACT

A method of manufacturing a semiconductor device having metal gates and the semiconductor device are disclosed. The method comprises providing a first sacrificial gate associated with a first conductive type transistor and a second sacrificial gate associated with a second conductive type transistor disposed over the substrate, wherein the first conductive type and the second conductive type are complementary; replacing the first sacrificial gate with a first metal gate structure; forming a patterned dielectric layer and/or a patterned photoresist layer to cover the first metal gate structure; and replacing the second sacrificial gate with a second metal gate structure. The method can improve gate height uniformity during twice metal gate chemical mechanical polish processes.

20 Claims, 25 Drawing Sheets

Figure 1:
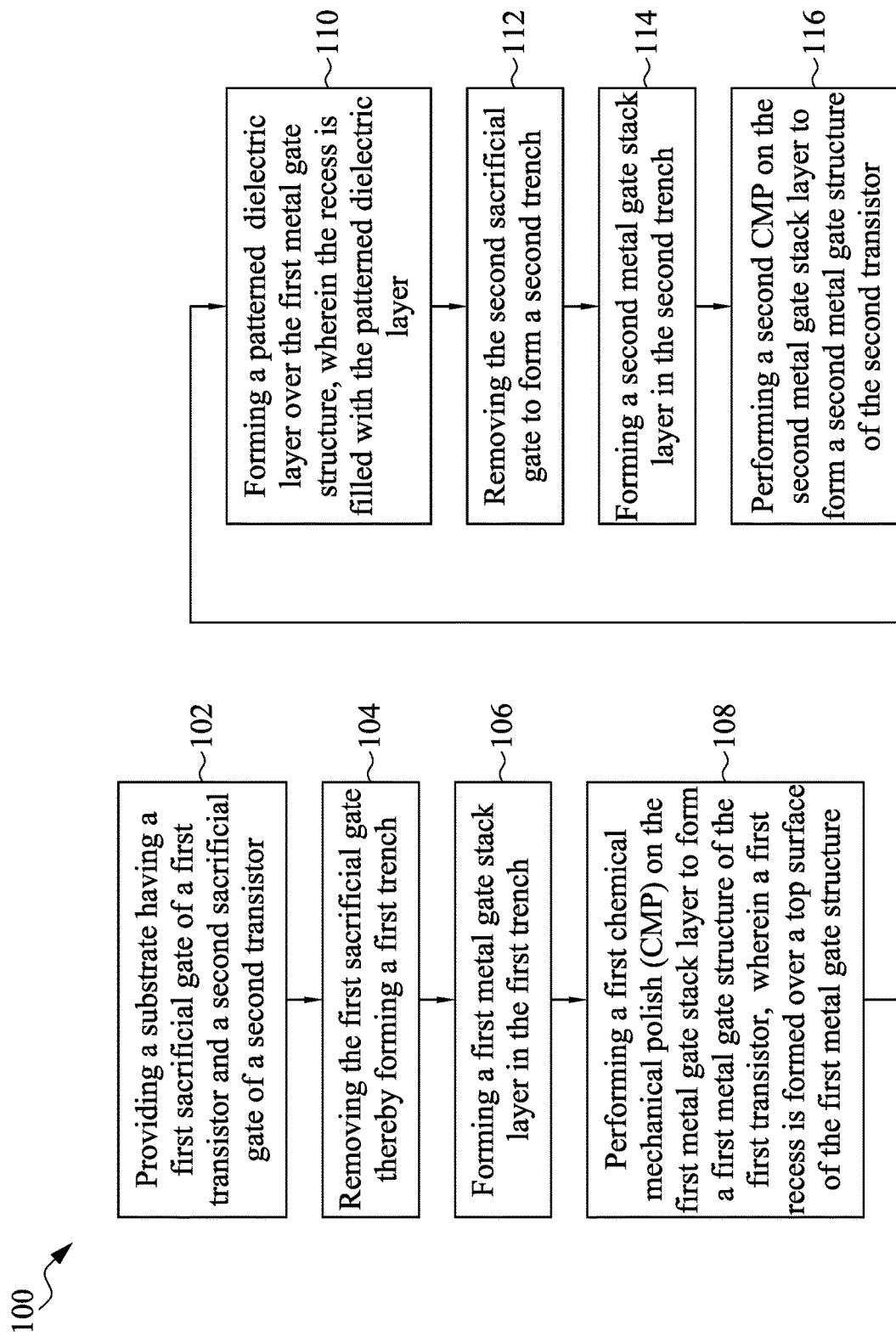

(51) Int. Cl.
  *H01L 21/321* (2006.01)
  *H01L 23/535* (2006.01)
  *H01L 27/092* (2006.01)
  *H01L 29/423* (2006.01)
  *H01L 29/49* (2006.01)
  *H01L 29/66* (2006.01)

(52) U.S. Cl.
  CPC .... *H01L 21/28123* (2013.01); *H01L 21/3212* (2013.01); *H01L 21/823842* (2013.01); *H01L 23/535* (2013.01); *H01L 27/092* (2013.01); *H01L 29/42376* (2013.01); *H01L 29/4966* (2013.01); *H01L 29/66545* (2013.01)

(58) Field of Classification Search
  CPC ........... H01L 21/823842; H01L 23/535; H01L 27/092; H01L 29/42376; H01L 29/4966; H01L 29/66545
  See application file for complete search history.

(56) References Cited

U.S. PATENT DOCUMENTS

| | | | |
|---|---|---|---|
| 2011/0156166 A1* | 6/2011 | Huang | H01L 29/66545 438/585 |
| 2014/0315361 A1 | 10/2014 | Niimi et al. | |
| 2015/0004779 A1 | 1/2015 | Zhu et al. | |
| 2015/0348788 A1 | 12/2015 | Liu | |
| 2017/0317213 A1 | 11/2017 | Park et al. | |
| 2019/0088666 A1* | 3/2019 | Tsui | H01L 29/7881 |
| 2019/0103324 A1 | 4/2019 | Perng et al. | |
| 2020/0058553 A1 | 2/2020 | Lim et al. | |

FOREIGN PATENT DOCUMENTS

| | | |
|---|---|---|
| KR | 1020170063398 A | 6/2017 |
| KR | 1020170122930 A | 11/2017 |
| KR | 1020190038256 A | 4/2019 |
| TW | 201239959 A1 | 10/2012 |
| TW | 201926571 A | 7/2019 |
| TW | 202002022 A | 1/2020 |
| TW | 202029350 A | 8/2020 |
| TW | 202040800 A | 11/2020 |

OTHER PUBLICATIONS

US 2017/154972 is the US counterpart of KR 1020170063398.
US 2013/270647 is the US counterpart of KR 1020150112908.
US 2016/190013 is the US counterpart of KR 1020160078210.
US 2017/317213 is the US counterpart of KR 1020170122930.
US 2019/103323 is the US counterpart of KR 1020190038256.
Notice of Allowance of Patent, Cited References and Search Report dated Aug. 1, 2024 issued by the Taiwan Intellectual Property Office for the Taiwan Counterpart Application No. 110121256.
U.S. 20200328186 A1 is the U.S. counterpart of TW 202040800.
U.S. 20200176581 A1 is the U.S. counterpart of TW 202029350.
U.S. 20190378722 A1 is the U.S. counterpart of TW 202002022.
U.S. 20190164765 A1 is the U.S. counterpart of TW 201926571.
English Abstract of TW 201239959 A.

* cited by examiner

METHOD AND STRUCTURE FOR METAL GATES

PRIORITY CLAIM AND CROSS-REFERENCE

This application is a continuation application of U.S. patent application Ser. No. 17/151,780, entitled "METHOD AND STRUCTURE FOR METAL GATES" filed on Jan. 19, 2021; the application is incorporated herein by reference in their entireties.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. As the dimensions of transistors decrease, the thickness of the gate oxide must be reduced to maintain performance with the decreased gate length. However, in order to reduce gate leakage, high dielectric constant (high-k) gate insulator layers are used which allow greater physical thicknesses while maintaining the same effective capacitance as would be provided by a typical gate oxide used in larger technology nodes.

Additionally, as technology nodes shrink, in some IC designs, there has been a desire to replace the typically polysilicon gate electrode with a metal gate (MG) electrode to improve device performance with the decreased feature sizes. One process of forming the MG electrode is termed "gate last" process, as opposed to another MG electrode formation process termed "gate first." The "gate last" process allows for reduced number of subsequent processes, including high temperature processing, that must be performed after formation of the gate.

BRIEF DESCRIPTION OF THE DRAWINGS

Aspects of the present disclosure are best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

FIG. 1 is a flow chart illustrating a method 100 of manufacturing a semiconductor device in accordance with some embodiments of the present disclosure.

FIGS. 2A-2I are cross-sectional views of a sequential process of manufacturing a semiconductor device 200 during various manufacturing stages according to the method of FIG. 1 in accordance with some embodiments of the present disclosure.

FIG. 3 is a flow chart illustrating a method 300 of manufacturing a semiconductor device in accordance with some embodiments of the present disclosure.

FIGS. 4A-4F are cross-sectional views of a sequential process of manufacturing a semiconductor device 200' during various manufacturing stages according to the method of FIG. 3 in accordance with some embodiments of the present disclosure.

FIGS. 5A-5H are cross-sectional views of a sequential process of manufacturing a semiconductor device 200" during various manufacturing stages according to the method of FIG. 1 in accordance with some embodiments of the present disclosure.

DETAILED DESCRIPTION OF THE DISCLOSURE

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure relates generally to the field of semiconductor devices, and relates more particularly to the manufacturing methods of the complementary metal-oxide-semiconductor (CMOS) devices with metal gate (MG) electrodes and the resulting semiconductor structure. The present disclosure relates to methods to reduce dishing effect for gate structures during chemical mechanical polishing (CMP) of gate layers and thus improve gate height uniformity. Large gate structures, such as analog devices, or MOS array can greatly benefit from the reduction of dishing effect.

In some comparative approaches, high-k metal gate (HKMG) replaced the polysilicon/nitride oxide gate stack for better channel gate control in order to overcome gate tunneling leakage and polysilicon deletion. One process of forming a metal gate stack is termed a replacement metal gate (RMG) or "gate-last" process in which the final gate stack is fabricated "last" which allows for reduced number of subsequent processes. Replacement metal gate introduces several new process constraints. HKMG integration introduces several new sources of threshold voltage ($V_T$) mismatch. One source is gate height variation caused by MG CMP dishing. Because gate charge cannot be completely contained inside the thin metal gate layer due to the limited metal gate conductivity but spills into the metal fill, the effective is also influenced by the metal fill work function. Mismatch is the differential performance of two or more devices on a single integrated circuit (IC), and should be avoided or eliminated for precise analog IC design. In particular, precise analog CMOS circuit design requires confident transistor mismatch models during the design and simulation stages or analog devices with a number of gate structures next to one another, the long gate lengths (or channel lengths) could result in dishing of gate structures during CMP processes.

MG-CMP would generate dishing and affect device characteristics for large channel lengths and large area devices. Some applications like analog and RF, it would need large area devices to boost performance. Since CMP processing involves using polishing pads, which could bend and result in dishing of large metal areas. Due to large gate lengths of analog devices and a number of them being placed next to one another, severe dishing could occur to result in significant loss of gate layers.

In addition, some comparative approaches can result in variations in the height of resultant replacement metal gates. This lack of planarity or uniformity arises, at least in part, in such comparative approaches from recesses or loss in dielectric material over and between the sacrificial gate structures. More particularly, the loss in dielectric material, disposed over and between the protective mask protecting the sacrificial gate structures, are translated into height variation in the sacrificial gate structures. The recesses in dielectric material, disposed over and between the protective mask overlap, protecting the sacrificial gate structures at the junction of p-type transistor and n-type transistor, are translated into height variation in the sacrificial gate structures. As explained further below, during the semiconductor fabrication process, a variety of gap fill materials such as, a flowable dielectric material (e.g., flowable oxide) are typically employed as dielectric material surrounding the sacrificial gate structures. However, the quality of gap fill may typically be poor and the flowable dielectric material may be vulnerable to subsequent wet/dry etch processing. Significant dielectric material/oxide loss can occur if subsequent wet/dry etch processing is excessive. This loss of dielectric material can affect the height variations of the sacrificial gate structures and thereby resulting in replacement metal gate height variations, during subsequent fabrication processing. Therefore, there is a need for mechanisms to reduce dishing of gate stacks and gate structures during CMP of gate stack layers described above.

The present disclosure relates generally to the field of semiconductor devices, and relates more particularly to the manufacturing methods of the complementary metal-oxide-semiconductor devices with metal gate electrodes and the resulting semiconductor structure. The present disclosure relates to methods to reduce dishing effect for gate structures during CMP of gate layers and thus improve gate height uniformity. Large gate structures, such as analog devices, can greatly benefit from the reduction of dishing effect. In the present disclosure, methods to improve MG CMP gate height uniformity during twice MG CMP processes and semiconductor devices obtained therefrom are disclosed. In some comparative approaches, the gate height difference may range from about 100 Å to about 200 Å, while in the present disclosure, the gate height difference can be improved to about 0 to about 80 Å or less than about 50 Å, as measured by atomic force microscopy (AFM) or transmission electron microscopy (TEM). The intermediate stages of forming the CMOS devices are illustrated.

With reference to FIGS. 1, 2A to 2I, 3, 4A to 4F, and 5A to 5H methods 100 and 300 and semiconductor devices 200, 200' and 200'' are collectively described below. The semiconductor devices 200, 200' and 200'' illustrate an integrated circuit, or portion thereof, that can comprise memory cells and/or logic circuits. The semiconductor devices 200, 200' and 200'' can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), CMOS transistors, high resistance transistors, high voltage transistors, and/or high frequency transistors; other suitable components; and/or combinations thereof. It is understood that additional steps can be provided before, during, and after the methods 100 and 300, and some of the steps described below can be replaced or eliminated, for additional embodiments of the methods. It is further understood that additional features can be added in the semiconductor devices 200, 200' and 200'', and some of the features described below can be replaced or eliminated, for additional embodiments of the semiconductor devices 200, 200' and 200''. In some embodiments, the semiconductor devices 200, 200' and 200'' are fabricated in a gate last process. In the gate last process, a sacrificial polysilicon gate structure is formed first and then the sacrificial polysilicon gate may be removed and replaced with a metal gate structure.

FIG. 1 is a flow chart illustrating a method 100 of manufacturing a semiconductor structure in accordance with some embodiments of the present disclosure. Referring to FIG. 1, the method 100 may be used to implement a replacement gate methodology to improve gate height uniformity. The method 100 includes a number of operations (102, 104, 106, 108, 110, 112, 114, and 116) and the description and illustration are not deemed as a limitation as the sequence of the operations and the structure of the semiconductor structure. FIGS. 2A-2I are schematic cross-sectional diagrams showing intermediate stages of a method of manufacturing a semiconductor device 200 in accordance with some embodiments of the present disclosure.

Figure 2A:
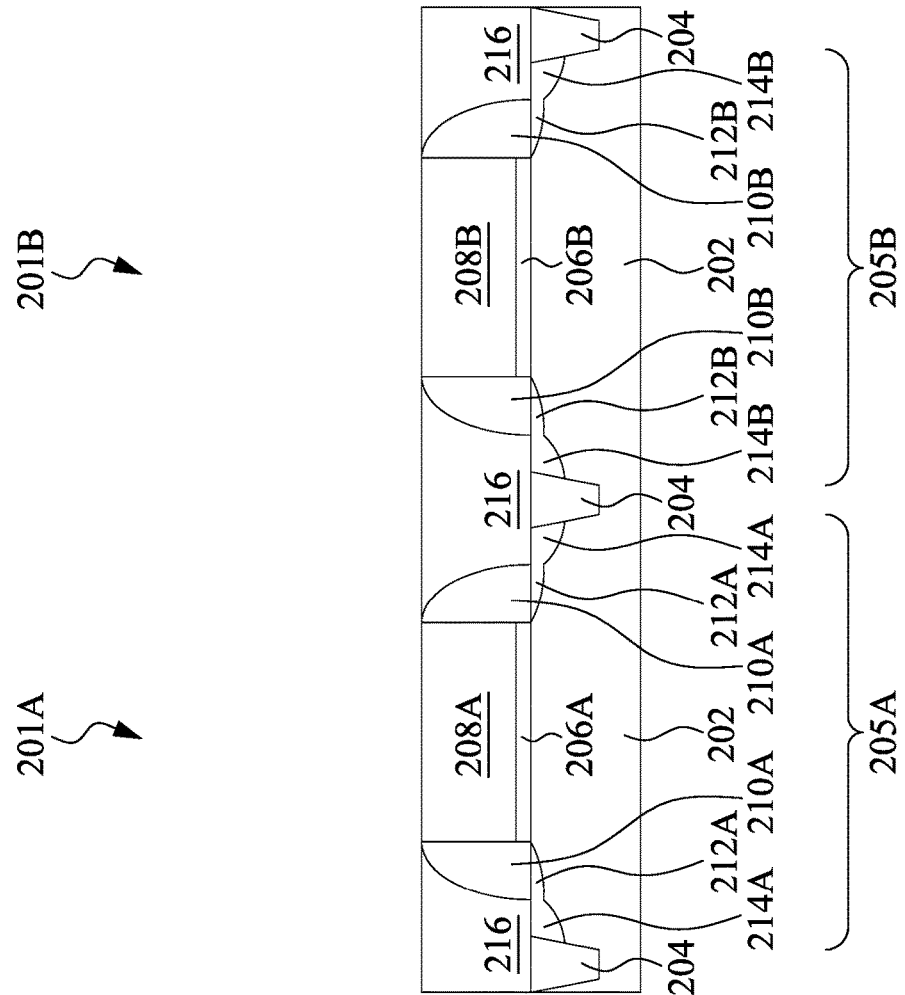

Referring to FIGS. 1 and 2A, the method 100 begins at block 102 where a substrate 202 having a first sacrificial gate 208A of a first transistor 201A and a second sacrificial gate 208B of a second transistor 201B disposed thereon and spaced apart from each other by an interlayer dielectric layer 216 is provided or received. In some embodiments, the substrate 202 is a semiconductor substrate comprising silicon. Alternatively, the substrate 202 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof or other suitable materials. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some embodiments, the semiconductor substrate may include a doped epi layer. In other examples, the silicon substrate may include a multilayer compound semiconductor structure. In some embodiments, the first transistor 201A has a first conductive type, the second transistor 201B has a second conductive type, and the first conductive type and the second conductive type are complementary. In some embodiments, the first conductive type of the first transistor 201A is p-type, and the second conductive type of the second transistor 201B is n-type.

In some embodiments, the substrate 202 may include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof or other suitable materials. The doped regions may be formed directly on the substrate 202, in a P-well structure, in an N-well structure, in a dual-well structure, or using a raised structure. In some embodiments, one or more isolation structures 204 may be formed in the substrate 202. The isolation structures 204 may utilize isolation technology, such as local oxidation of silicon (LOCOS) or shallow trench isolation (STI). The isolation structures 204 may comprise silicon oxide, silicon nitride, silicon oxynitride, fluoride-doped silicate glass (FSG), a low-k dielectric material, other suitable materials, or combinations thereof. An exemplary operation of forming the isolation structures 204 may include patterning the substrate 202 by a photolithography operation, etching trenches in the substrate 202 using, for example, a dry etching, a wet etching, or a plasma etching operation, and depositing a dielectric material in the trenches. In some embodiments, the filled trench may have a multi-layer structure such as a thermal oxide liner layer filled with silicon nitride or silicon oxide.

In some embodiments, the substrate 202 may further include various active regions, such as regions configured for a P-type metal-oxide-semiconductor transistor (referred to as a PMOS) device and regions configured for an N-type metal-oxide-semiconductor transistor (referred to as an NMOS) device, and the isolation regions 204 are used to isolate and define the active regions. In some embodiments, the substrate 202 includes a first region 205A configured for a PMOS transistor device and a second region 205B configured for a NMOS transistor device. It is understood that the semiconductor device 200 may be formed by CMOS technology, and thus same processes are not described in detail herein.

Still referring to FIG. 2A, a first sacrificial gate 208A and a second sacrificial gate 208B are respectively formed in the first region 205A and the second region 205B over the substrate 202. It is understood that a plurality of sacrificial gates may be formed over the substrate 202 in the first region 205A and the second region 205B. In some embodiments, a first dielectric layer 206A is formed between the substrate 202 and the first sacrificial gate 208A, and a second dielectric layer 206B is formed between the substrate 202 and the second sacrificial gate 208B. The dielectric layers 206A and 206B may include silicon oxide, silicon oxynitride, high-k dielectric materials or a combination thereof or other suitable materials. In some embodiments, the sacrificial gates 208A and 208B include a single layer or multilayer structure. In some embodiments, the sacrificial gates 208A and 208B include polysilicon. In some embodiments, the dielectric layers 206A and 206B and the sacrificial gates 208A and 208B may be formed by sequentially depositing a dielectric layer and a conductive layer over the substrate 202 in a blanket manner. The deposition step may include physical vapor deposition (PVD), chemical vapor deposition (CVD), atomic layer deposition (ALD) or other suitable methods. Then, a photoresist (not shown) is formed over the deposited materials and patterned. An etching operation is performed to transfer the features of the patterned photoresist to the underlying layers so as to form the dielectric layers 206A and 206B and the sacrificial gates 208A and 208B.

In some embodiments, lightly doped source/drain (LDD) regions 212A and 212B are respectively formed in the respective doped wells (not shown) on two sides of each of the sacrificial gates 208A and 208B. In some embodiments, the LDD regions 212A are formed between the isolation structures 204 and the first sacrificial gate 208A, and the LDD regions 212B are formed between the isolation structures 204 and the second sacrificial gate 208B. In some embodiments, the LDD regions 212A and 212B may be formed in the substrate 202 by an implantation operation, such as an ion implantation step. In some embodiments, the LDD regions 212A and 212B are aligned with sidewalls of the sacrificial gates 208A and 208B. Subsequent to the forming of the LDD regions 212A and 212B, spacers 210A are formed on each side of the first sacrificial gate 208A, and spacers 210B are formed on each side of the second sacrificial gate 208B. The spacers 210A and 210B may comprise a dielectric material such as silicon nitride, silicon oxide, silicon carbide, silicon oxynitride or combinations thereof or other suitable materials. In some embodiments, the spacers 210A and 210B comprise a multilayer structure. The spacers 210A and 210B may be formed using deposition operations, such as PVD, CVD or ALD, or etching operations. The etching operation may be an anisotropic etching. Thereafter, source/drain (S/D) regions 214A and 214B may be respectively formed in the respective doped wells (not shown) between the isolation structures 204 and the spacers 210A and 210B. In some embodiments, the S/D regions 214A and 214B are formed using an ion implantation step and the implanted profiles are substantially aligned with outer sidewalls of the spacers 210A and 210B.

An interlayer (or inter-level) dielectric (ILD) 216 is subsequently formed over the substrate 202. The ILD layer 216 may fill the gaps between the first transistor 201A and the second transistor 201B, and surrounds the first transistor 201A and the second transistor 201B. The ILD layer 216 may comprise a dielectric material and is formed by any suitable deposition operation. The formation may include, for example, CVD, FCVD, or the like. The dielectric material may comprise silicon oxide, silicon nitride, silicon oxynitride, spin-on glass (SOG), FSG, polyimide or other suitable dielectric materials. In some embodiments, the ILD layer 216 may include a high-density plasma (HDP) dielectric material (e.g., HDP oxide) and/or a high aspect ratio process (HARP) dielectric material (e.g., HARP oxide). Then, a planarization operation is performed to remove excess portions of the ILD layer 216. The planarization operation may include a CMP operation or mechanical grinding. The top surfaces of the sacrificial gates 208A and 208B are exposed accordingly. In some embodiments, the top surfaces of the ILD layer 216 and the sacrificial gates 208A and 208B are leveled by the planarization operation.

Figure 2B:
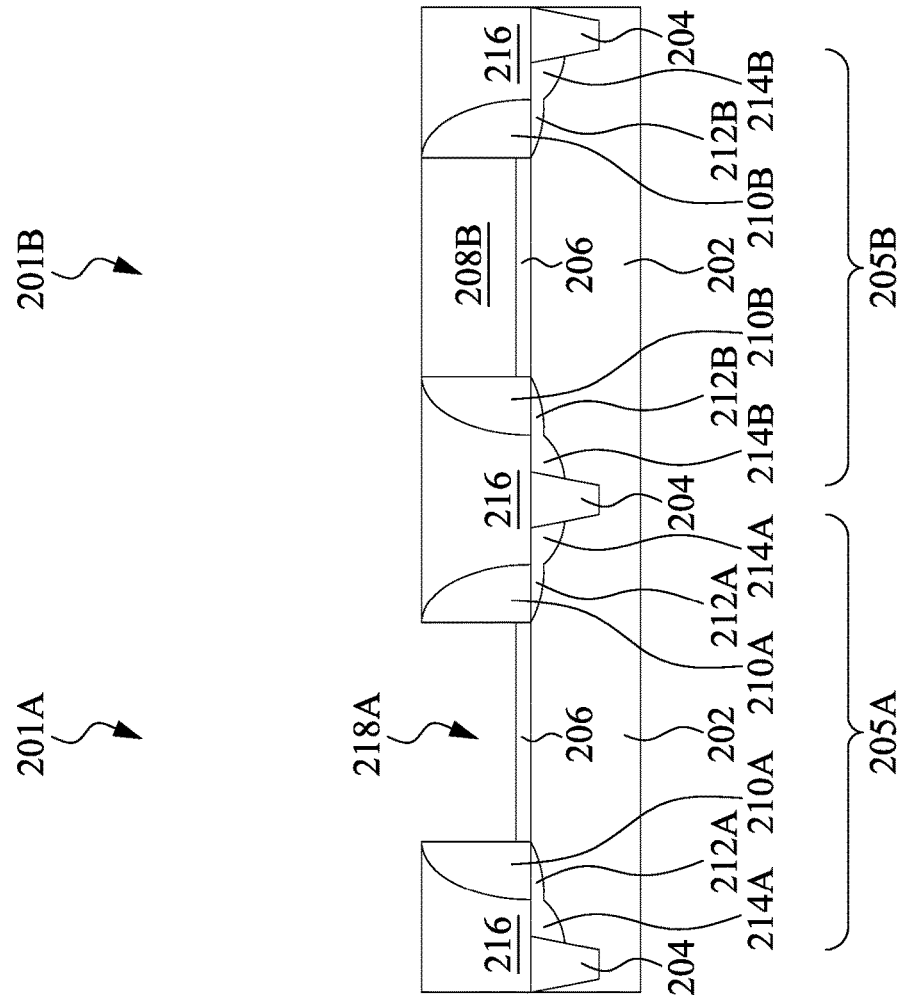

Subsequently, a first metal gate structure and a second metal gate structure for the respective transistors are respectively to be formed in place of the corresponding sacrificial gates. Referring to FIGS. 1 and 2B, at block 104, one of the sacrificial gates is removed thereby forming a first trench in the interlayer dielectric layer. In some embodiments, the first sacrificial gate 208A is initially removed from the respective transistor 201A. As a result, an exemplary first trench 218A is formed as defined by the spacers 210A and surrounded by the ILD layer 216. In some embodiments, the first sacrificial gate 208A may be removed in an etching operation, such as a wet etch, a dry etch or combinations thereof or other suitable methods. In some embodiments, the first dielectric layer 206A remains in the first trench 218A and serves as an interfacial layer (IL) after the first sacrificial gate 208A removing operation. In alternative embodiments, the first dielectric layer 206A is removed during the etching of the first sacrificial gate 208A. In some embodiments, the wet etch operation for the first sacrificial gate 208A includes exposure to a hydroxide containing solution (e.g., ammonium hydroxide), deionized water, or other suitable etchant solutions.

Figure 2C:
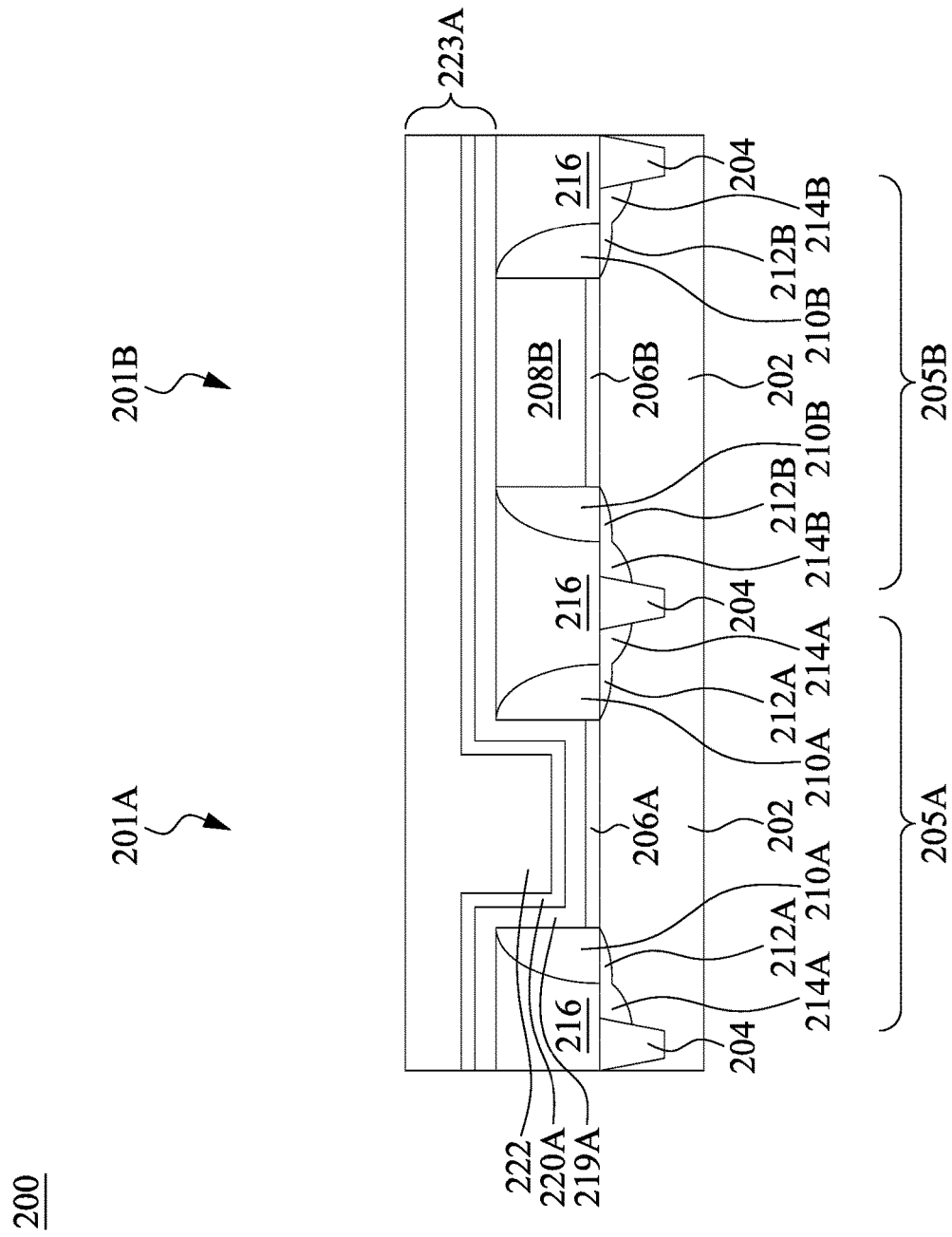

At block 106, a first metal gate stack layer is formed in the first trench. The first metal gate stack layer 223A may comprise a first high-k gate dielectric layer, a first work function layer and a first metallic material layer. FIG. 2C shows deposition of a first high-k gate dielectric layer 219A in the first trench 218A, and a first work function layer 220A over the first high-k gate dielectric layer 219A. The first high-k gate dielectric layer 219A and the first work function layer 220A are formed over the substrate 202 and in the first trench 218A by any suitable process to any suitable thickness. In some embodiments, the first high-k gate dielectric layer 219A and the first work function layer 220A are respectively conformally formed over the sidewalls and a bottom surface of the first trench 218A. In some embodiments, the first high-k gate dielectric layer 219A and the first work function layer 220A respectively line sidewalls and a bottom of the first trench 218A without filling up the first trench 218A. In some embodiments, the first high-k gate dielectric layer 219A may include, such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al2O_3$) alloy, or combinations thereof or other suitable materials. In some embodiments, the first work function layer 220A for the first PMOS device may include one or more layer comprised of materials such as TiN, W, Ta, Ni, Pt, Ru, Mo, Al, WN, combinations thereof, or the like. The first work function layer 220A may be formed using PVD, CVD, ALD, or other suitable deposition methods. In some embodiments, a capping layer (not shown) may be formed between the first dielectric layer 206A and the first work function layer 220A over the substrate 202, and is conformally formed over the ILD layer 216 and on the sidewalls and a bottom of the first trench 218A. Then, a first metallic material layer 222 is deposited over the first work function layer 220A to substantially fill in the remainder of the first trench 218A, as illustrated in FIG. 2C. The first metallic material layer 222 also fills the spaces in the first trench 218A surrounded by the first work function layer 220A. In some embodiments, the first metallic material layer 222 extends so as to cover the first region 205A and/or the second region 205B. In some embodiments, the first metallic material layer 222 includes any suitable material, such as copper, cobalt, aluminum, tungsten, or other suitable materials, and/or combinations thereof. In some embodiments, the first metallic material layer 222 is formed by any suitable process, such as ALD, CVD, PVD or plating, to any suitable thickness.

Figure 2D:
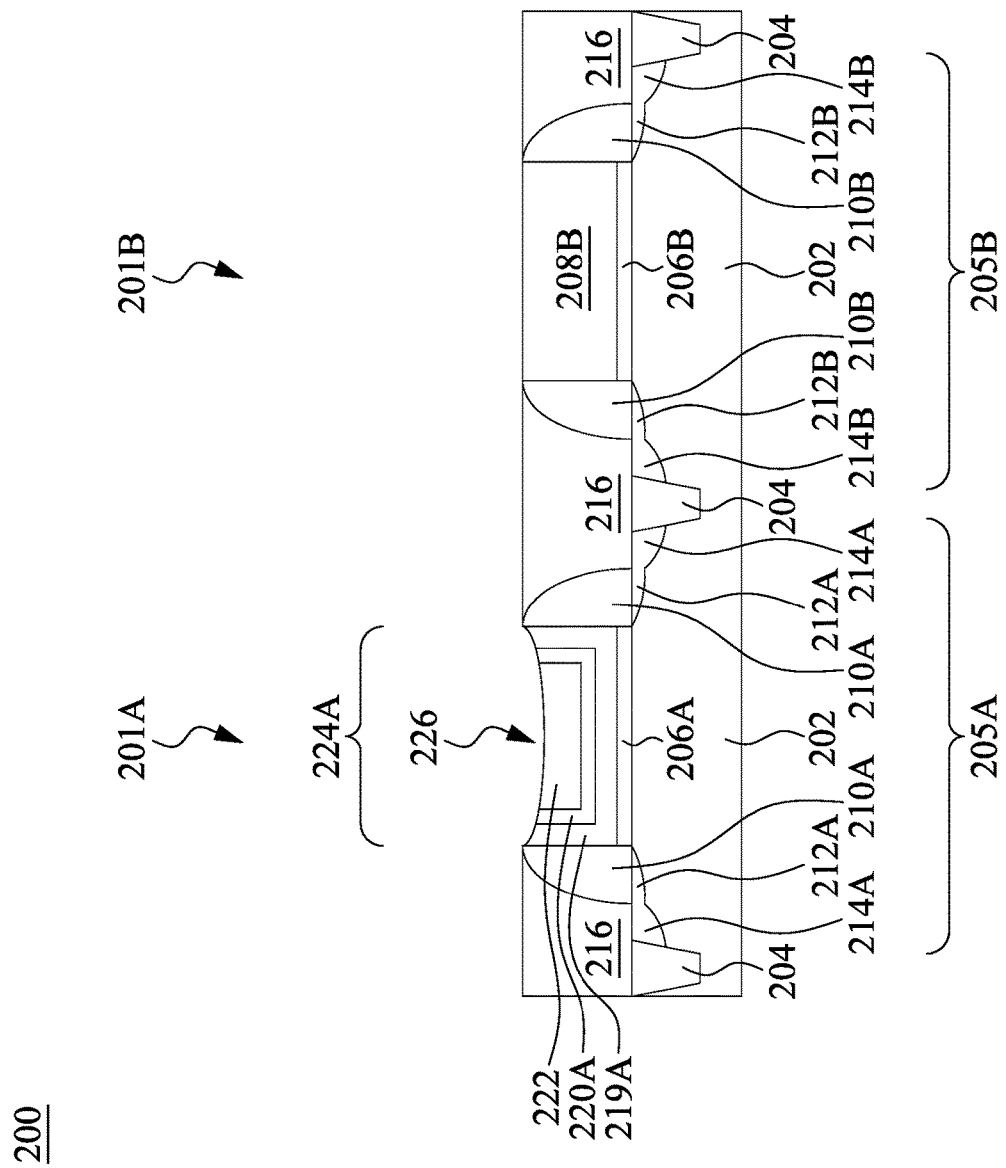

At block 108, a first CMP is performed on the first metal gate stack layer, wherein a remaining portion of the first metal gate stack layer forms a first metal gate of the first transistor. Referring to FIG. 2D, after the first trench is filled with the first metallic material layer 222, a planarization operation (e.g., a CMP or mechanical grinding operation) is performed to level the first high-k gate dielectric layer 219A, the first work function layer 220A and the first metallic material layer 222. In some embodiments, the CMP process is performed to planarize the first metallic material layer 222 until an upper surface of the ILD layer 216 is reached and exposed. As a result, a first metal gate structure 224A is formed such that the first metal gate structure 224A for the PMOS device comprises the first dielectric layer 206A, the first high-k gate dielectric layer 219A, the first work function layer 220A, and the first metallic material layer 222. Referring to FIG. 2D, a recess 226 is formed over a top surface of the first metal gate structure 224A or a top surface of the first metallic material layer 222 caused by dishing of gate structures during the CMP processes. In some embodiments, dishing has a strong line width dependency, and thus the amount of dishing becomes larger as the line width increases.

Figure 2E:
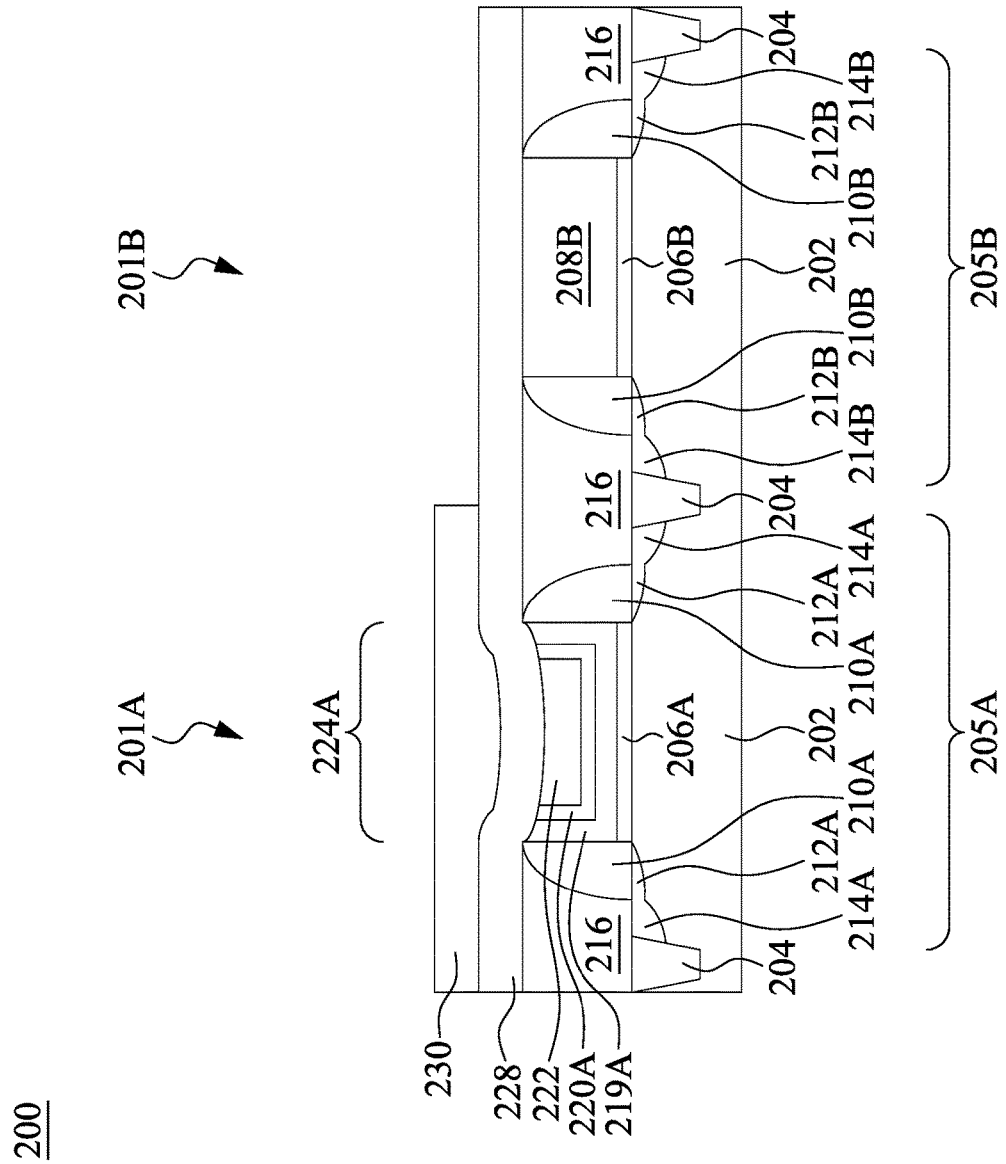

At block 110, a patterned dielectric layer is formed over the first metal gate structure, wherein the recess is filled with the patterned dielectric layer. Referring to FIG. 2E, an extra dielectric layer 228 may be deposited over the substrate 202 to at least cover the first transistor 201A or cover the first transistor 210A and the second transistor 201B. In some embodiments, the dielectric layer 228 extends to cover the first region 205A and the second region 205B. In some embodiments, the dielectric layer 228 can fill in the recess 226. In some embodiments, the recess 226 is filled with the dielectric layer 228. In some embodiments, the dielectric layer 228 may comprise a dielectric material and is formed by any suitable deposition operation. The formation may include, for example, CVD, FCVD, or the like. The dielectric material may comprise silicon oxide, silicon nitride, silicon oxynitride, SOG, FSG, polyimide or other suitable dielectric materials. In some embodiments, the dielectric layer 228 has a thickness ranging from about 20 Å to about 80 Å. In the present embodiment, if the thickness of the dielectric layer 228 is too thin, e.g., less than about 20 Å, the dielectric layer 228 would have no protection function. In contrast, if the thickness of the dielectric layer 228 is too thick, e.g., greater than about 80 Å, extra polishing would be needed at the subsequent procedure.

Still referring to FIG. 2E, a patterned photoresist layer 230 is formed over the substrate 202 to at least cover the first metal gate structure 224A or the first region 205A. In some embodiments, a photoresist layer (not shown) is formed over the first metal gate structure 224A and patterned. In some embodiments, a patterned photoresist layer 230 is formed over the first transistor 201A of the first region 205A to protect the first transistor 201A from subsequent processing. The patterned photoresist layer 230 is formed by a typical photolithography and patterning process, and may comprise any suitable material.

Figure 2F:
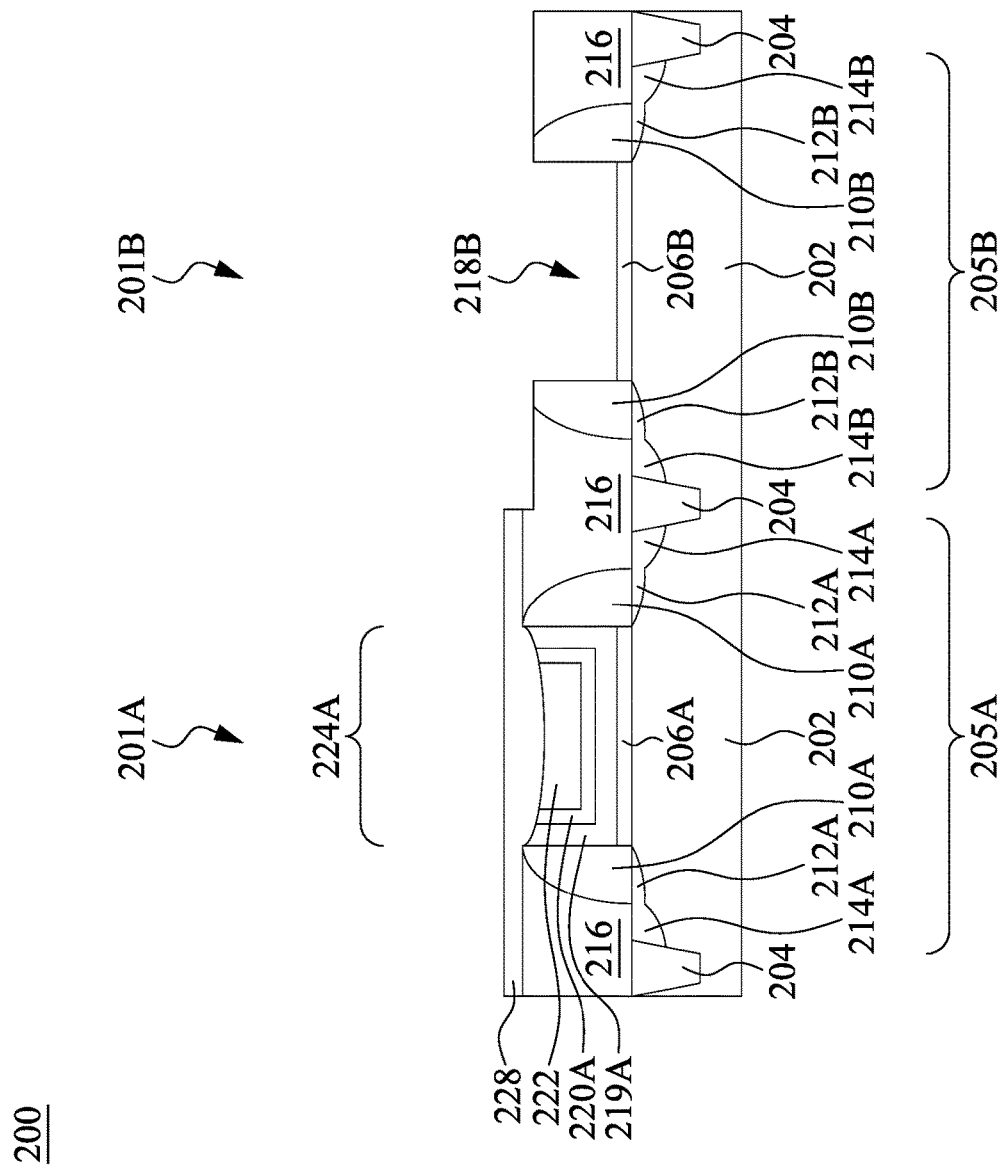

At block 112, the second sacrificial gate is removed to form a second trench. Referring to FIG. 2F, the patterned dielectric layer 228 is formed via the patterned photoresist layer 230, and the second sacrificial gate 208B is removed from the second transistor 201B in the second region 205B by any suitable process to form a second trench 218B. In some embodiments, a portion of the ILD layer 216 and the spacers 210B around the second sacrificial gate 208B may be removed. In some embodiments, the removed portion of the ILD layer 216 has a thickness ranging from about 60 Å to about 70 Å. In some embodiments, due to the protection of the patterned dielectric layer 228, recesses issue or loss in the ILD layer 216 and/or spacers 210A around the first metal gate structure 224A can be mitigated. In some embodiments, removing the second sacrificial gate 208B comprises keeping the spacers 210B of the second transistor 201B intact in the ILD layer 216. In some embodiments, the second trench 218B may be formed by one or more dry etching processes, wet etching process, or combinations thereof or other suitable processes. In some embodiments, at least a portion of the patterned dielectric layer 228 not covered by the patterned photoresist layer 230 is also removed. Subsequently, the patterned photoresist layer 230 may be removed by a stripping or ashing process or etching process. After the pattered photoresist layer 230 is removed, a portion of the patterned dielectric layer 228 remains on a surface of the first metal gate structure 224A of the first transistor 201A. In some embodiments, the patterned photoresist 230 may be removed prior to the removing of the second sacrificial gate 208B, such that the patterned dielectric layer 228 becomes thinner during removing the second sacrificial gate 208B. In some embodiments, the remaining patterned dielectric layer 228 may be used as a stop layer in the subsequent second CMP.

Figure 2G:
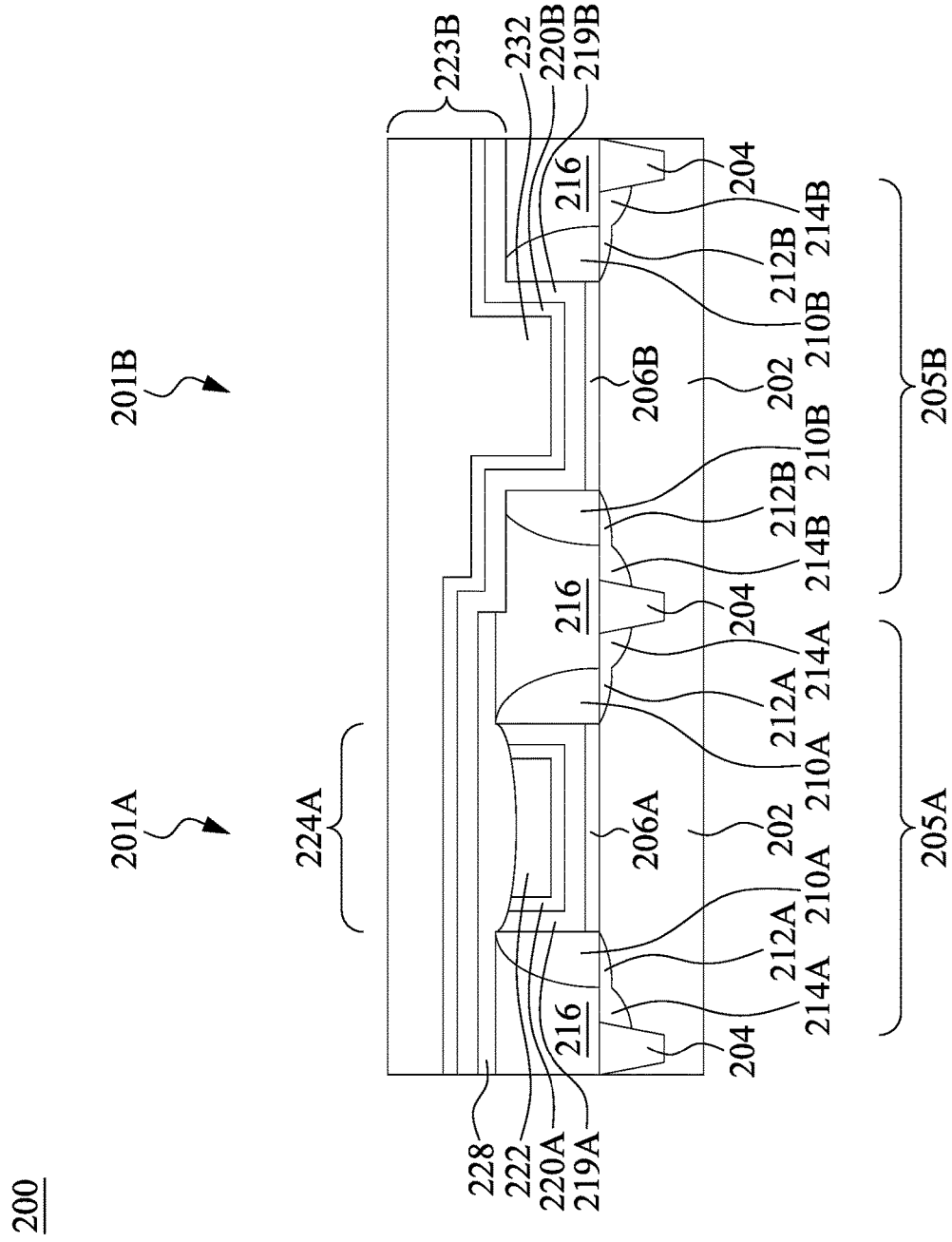

At block 114, a second metal gate stack layer is formed in the second trench left by the removed second sacrificial gate. Referring to FIG. 2G, in some embodiments, a second metal gate stack layer 223B may comprise a second high-k gate dielectric layer 219B, a second work function layer 220B and a second metallic material layer 232. FIG. 2G shows the sequential deposition of the second high-k gate dielectric layer 219B and the second work function layer 220B in the second trench 218B. The second high-k gate dielectric layer 219B and the second work function layer 220B are respectively formed over the substrate 202 and in the second trench 218B by any suitable process to any suitable thickness. In some embodiments, the second high-k gate dielectric layer 219B and the second work function layer 220B are respectively conformally formed over the sidewalls and a bottom surface of the second trench 218B. In some embodiments, the second high-k gate dielectric layer 219B and the second work function layer 220B respectively lines sidewalls and a bottom of the second trench 218B without filling up the second trench 218B. In some embodiments, the second high-k gate dielectric layer 219B may be the same or different from the first high-k gate dielectric layer 219A. In some embodiments, the second work function layer 220B for the NMOS device may include one or more layer comprised of materials such as Ti, Ag, Al, TiAlMo, Ta, TaN, TiAlC, TiAlN, TaC, TaCN, TiAl, TaSiN, Mn, Zr, combinations thereof, or the like. The second work function layer 220B may be formed using PVD, CVD, ALD, or other suitable deposition methods. In some embodiments, a capping layer (not shown) may be formed between the second dielectric layer 206B and the second work function layer 220B over the substrate 202, and is conformally formed over the sidewalls and a bottom of the second trench 218B. Then, the second metallic material layer 232 is deposited over the second work function layer 220B to substantially fill in the remainder of the second trench 218B, as illustrated in FIG. 2G. In some embodiments, the second metallic material layer 232 also fills the spaces in the second trench 218B surrounded by the second work function layer 220B. In some embodiments, the second metallic material layer 232 extends to cover the first region 205A and/or the second region 205B. In some embodiments, the second metallic material layer 232 includes any suitable material, such as copper, cobalt, aluminum, tungsten, or other suitable materials, and/or combinations thereof. In some embodiments, the second metallic material layer 232 is formed by any suitable process to any suitable thickness, such as ALD, CVD, PVD or plating.

Figure 2H:
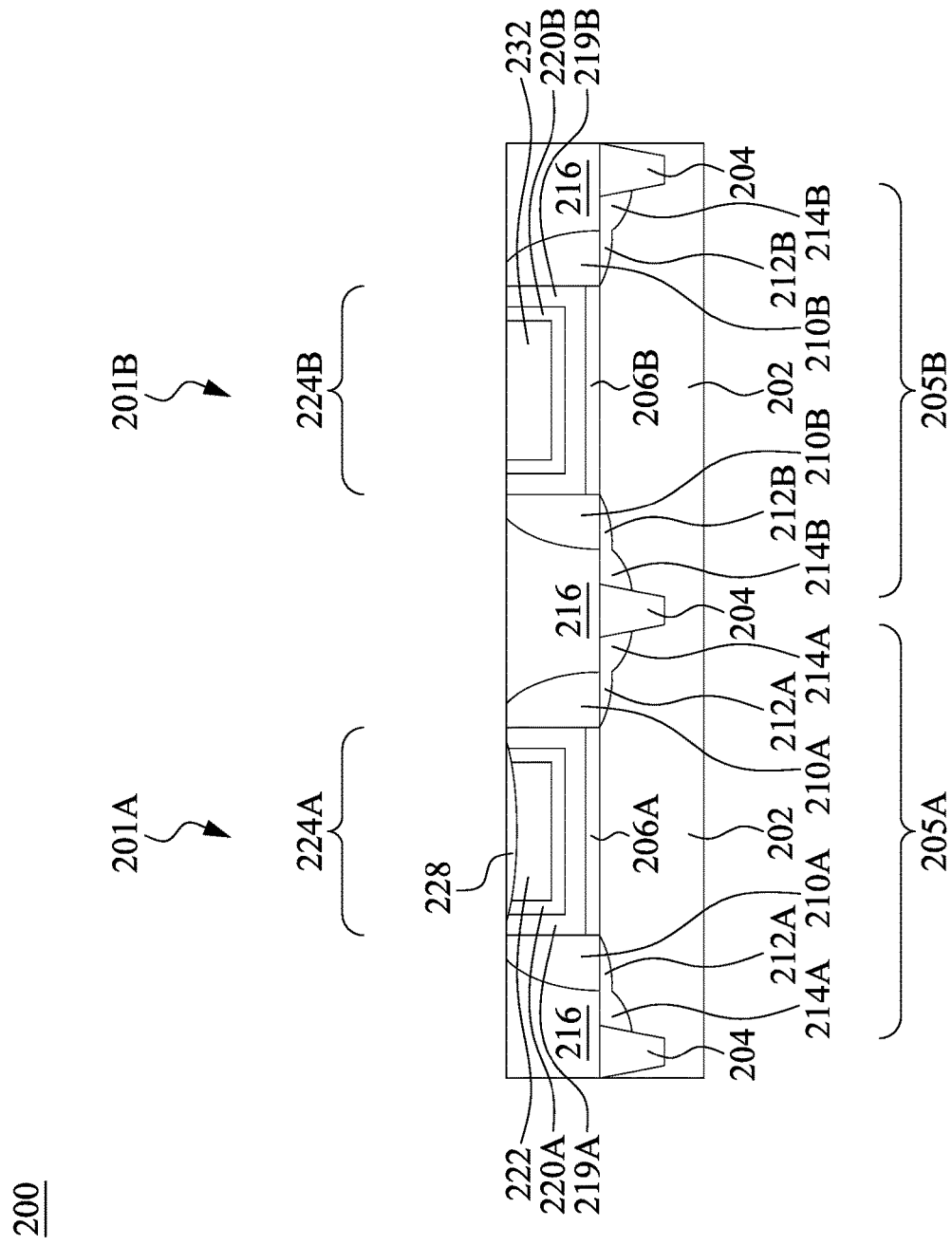

At block 116, a second CMP is performed on the second metal gate stack layer, wherein a remaining portion of the second metal gate stack layer forms a second metal gate structure of the second transistor. In some embodiments, less CMP dishing during the second CMP is formed due to selectivity. Referring to FIG. 2H, after the second trench 218B is filled with the second metallic material layer 232, a planarization operation (e.g., a CMP or mechanical grinding operation) is performed to level the second high-k gate dielectric layer 219B, the second work function layer 220B and the second metallic material layer 232. In some embodiments, the CMP process is performed to planarize the second metallic material layer 232 until an upper surface of the ILD layer 216 is reached and exposed. As a result, a second metal gate structure 224B is formed such that the second metal gate structure 224B for the NMOS device comprises the second dielectric layer 206B, the second high-k gate dielectric layer 219B, the second work function layer 220B and the second metallic material layer 232.

Still referring to FIG. 2H, after the second CMP, at least a portion of the patterned dielectric layer 228 remains over the first metal gate structure 224A or the first metallic material layer 222. In some embodiments, the patterned dielectric layer 228 over the top surface of the first metal gate structure 224A has a thickness ranging from larger than about 0 to about 20 Å. In some embodiments, a top surface of the patterned dielectric layer 228 remaining on the first metal gate structure 224A is substantially coplanar with a top surface of the second metal gate structure 224B. In some embodiments, a top surface of the patterned dielectric layer 228 over the first metal gate structure 224A is aligned with a top surface of the second metal gate structure 224B after the second CMP. In some embodiments, the patterned dielectric layer 228 over the first metal gate structure 224A may be removed after the second CMP. In some embodiments, the patterned dielectric layer 228 over the first metal gate structure 224A is removed after the second CMP in the situation that the patterned dielectric layer 228 is formed of a different material from the ILD layer 216; for example, when the patterned dielectric layer 228 comprises silicon nitride and the ILD layer 216 comprises silicon oxide.

In some embodiments, the semiconductor device 200 comprises the first metal structure 224A of a first conductive type transistor disposed over the substrate 202, which comprises the first high-k gate dielectric layer 219A, the first work function layer 220A over the first high-k gate dielectric layer 219A, and the first metallic material layer 222 over the second work function layer 220A. In some embodiments, the semiconductor device 200 comprises the dielectric layer 228 over the first metal gate structure 224A or the first metallic material layer 222. In some embodiments, the semiconductor device 200 comprises the second metal gate structure 224B of a second conductive type transistor disposed over the substrate 202, and the second metal gate structure 224B comprises the second high-k gate dielectric layer 219B, the second work function layer 220B over the second high-k gate dielectric layer 219B, and the second metallic material layer 232 over the second work function layer 220B. In some embodiments, the first conductive type and the second conductive type are complementary. In some embodiments, a top surface of the dielectric layer 228 is substantially coplanar with a top surface of the second metal gate structure 224B.

Figure 2I:
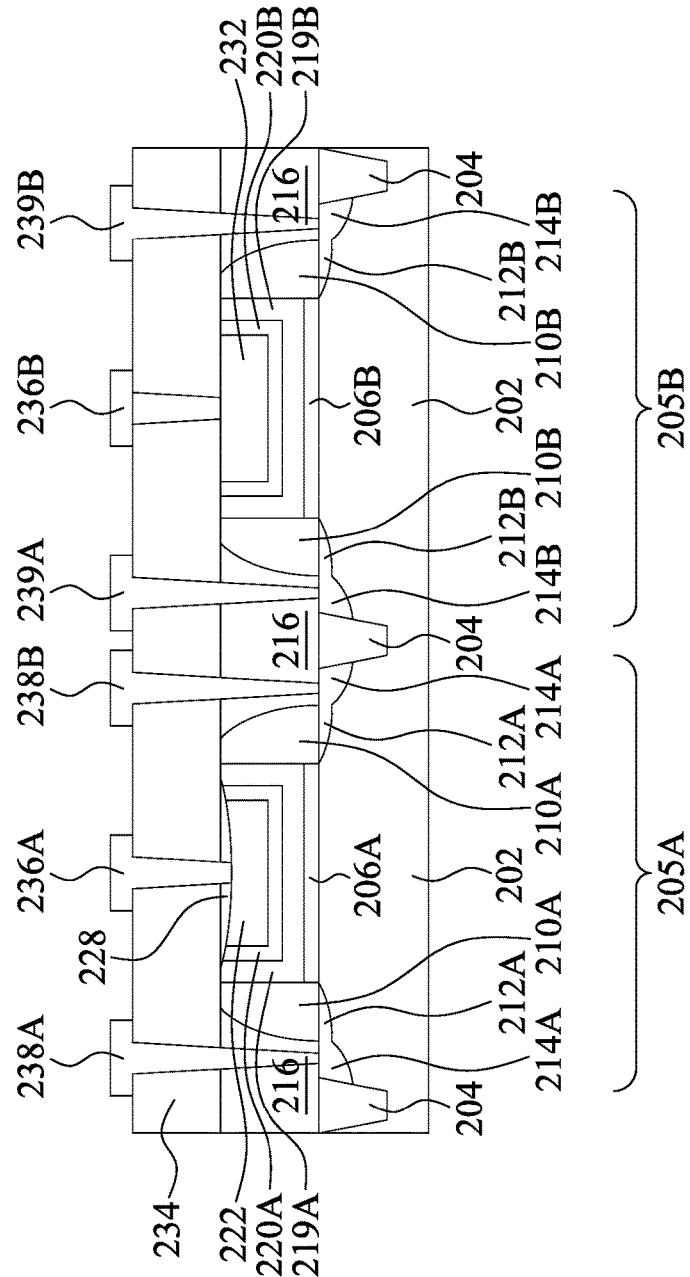

Referring to FIG. 2I, a passivation layer 234 is formed over the first metal gate structure 224A and the second metal gate structure 224B, and contact plugs 236A, 236B, 238A, 238B, 239A, and 239B are respectively formed in the passivation layer 234 and the ILD layer 216. In some embodiments, the contact plug 236A is in contact with the patterned dielectric layer 228. In some embodiments, the contact plug 236A penetrates the patterned dielectric layer 228, such that the contact plug 236A is surrounded by the dielectric layer 228. For example, a portion of sidewalls of the contact plug 236A is in contact with the patterned dielectric layer 228.

It is understood that the PMOS and NMOS transistor structures may be formed in any order. Further, during the formation of the metal gate structures for the first/PMOS device region 205A and the second/NMOS device region 205B, N/P patterning may be implemented to separate one type of device from the other, and vice versa. The metal gate stacks may further comprise liner layers, barrier layers, other suitable layers, and/or combinations thereof. It is also understood that the semiconductor device 200 may undergo further CMOS or MOS technology processing to form various features known in the art. Subsequent processing may form various contacts/vias/lines and multilayer interconnect features (e.g., metal layers and interlayer dielectrics) on the substrate 202, configured to connect the various features or structures of the semiconductor device 200. The remaining patterned dielectric layer 228 on the first metal gate structure 224A is very thin and does not affect the formation or performance of the subsequent processing. The additional features may provide electrical interconnection to the device including the formed metal gate structures. For example, a multilayer interconnection includes vertical interconnects, such as typical vias or contacts, and horizontal interconnects, such as metal lines. The various interconnection features may implement various conductive materials including copper, tungsten, and/or silicide. In one example a damascene and/or dual damascene process is used to form a copper related multilayer interconnection structure. In some embodiments, loss in ILD layer/sidewalls around the first metal gate structure 224A can be reduced or prevented. The patterned dielectric layer 228 over the first metal gate structure 224A can fill in the recess generated due to MG CMP dishing, but will not increase the complexity of processing. By the formation of the patterned dielectric layer 228 remaining on the first metal gate structure 224A, a top surface of the first metal gate structure 224A is substantially coplanar with a top surface of the second metal gate structure 224B. Accordingly, the gate height uniformity or CMP uniformity, especially for large area devices or long channel devices can be improved.

Figure 3:
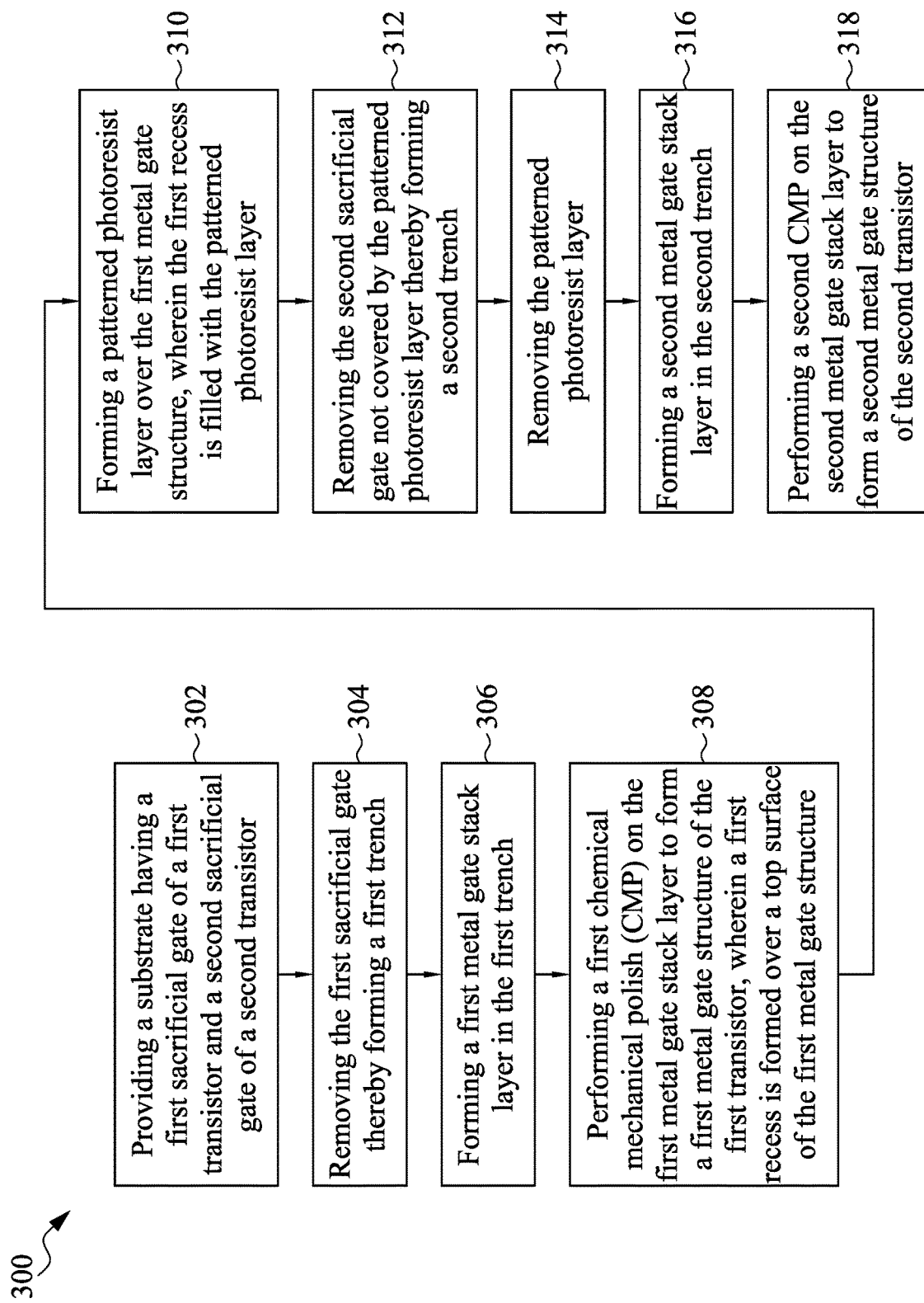

FIG. 3 is a flow chart illustrating a method 300 of manufacturing a semiconductor structure in accordance with some embodiments of the present disclosure. Referring to FIG. 3, the method 300 may be used to implement a replacement gate methodology to improve gate height uniformity. The method 100 includes a number of operations (302, 304, 306, 308, 310, 312, 314, 316, and 318) and the description and illustration are not deemed as a limitation as the sequence of the operations and the structure of the semiconductor structure. FIGS. 4A-4F are schematic cross-sectional diagrams showing intermediate stages of a method of manufacturing a semiconductor device 200' in accordance with some embodiments of the present disclosure.

In FIGS. 3 and 4A-4F, like reference numerals will be given to like portions to those which have already been described above so as to omit the repetition of similar descriptions. In addition, portions about which no particular description will be made have the similar constructions to those of the semiconductor device 200 described above and provide the same or similar advantages provided thereby.

Figure 4A:
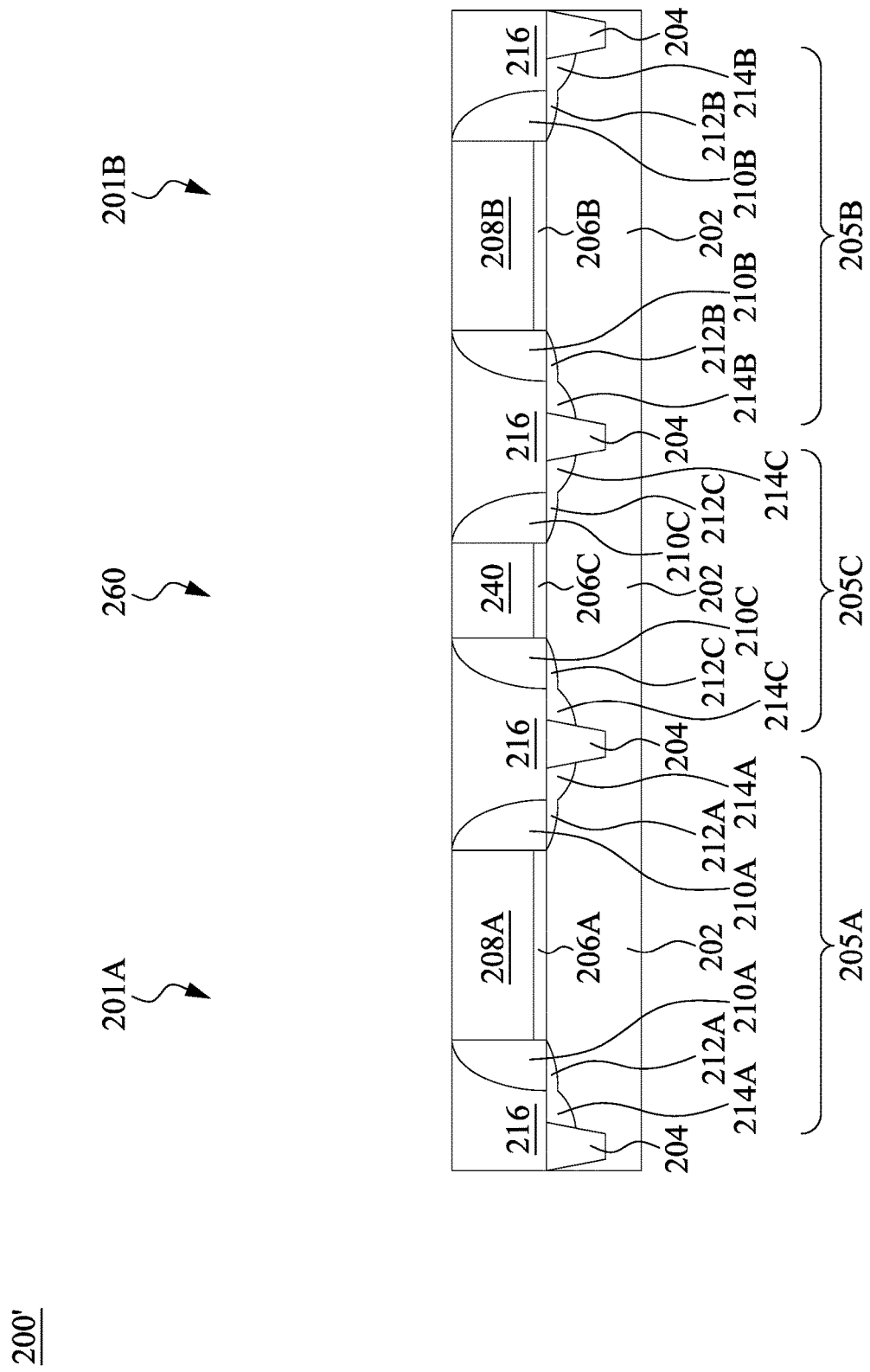

Referring to FIGS. 3 and 4A, the method 300 begins at block 302 where a substrate 202 having a first sacrificial gate 208A of a first transistor 201A, a second sacrificial gate 208B of a second transistor 201B, and a high-resistance (HiR) polysilicon gate 240 of a third transistor 260 disposed thereon and spaced apart from each other by an interlayer dielectric layer 216 is provided or received. In some embodiments, the substrate 202 may include a semiconductor substrate, e.g., a silicon substrate, and one or more isolation structures 204 may be formed in the substrate 202. In some embodiments, the substrate 202 includes a first region 205A configured for accommodating the first transistor 201A, a second region 205B configured for accommodating the second transistor 201B, and a third region 205C configured for accommodating the third transistor 260. In some embodiments, the first region 205A is a PMOS transistor region, the second region 205B is an NMOS transistor region, and the third region 205C is an active region configured for a high-resistance polysilicon transistor. It is understood that a plurality of gate structures or sacrificial gates or other components may be formed over the substrate 202 in the first region 205A, the second region 205B, and the third region 205C. In some embodiments, the third transistor 260 can be disposed between the first transistor 201A and the second transistor 201B, but the disclosure is not limited thereto. In some embodiments, gate lengths of the first sacrificial gates 208A and 208B are larger than a gate length of the high-resistance polysilicon gate 240. In some embodiments, the first sacrificial gate 208A has a gate length of about 40 nm or more or about 1 μm or more, and the second sacrificial gate 208B has a gate length of about 40 nm or more or about 1 μm or more, but the disclosure is not limited thereto. In some embodiments, the high-resistance polysilicon gate 240 has a gate length of less than about 40 nm, or about 28 nm or less, or about 22 nm or less, but the disclosure is not limited thereto. In some embodiments, the high-resistance polysilicon gate 240 may serve as a high-resistance resistor. In some embodiments, gate lengths of the first sacrificial gates 208A and 208B are less than a gate length of the high-resistance resistor.

In some embodiments, a spacer 210C is formed on each side of the polysilicon gate electrode 240; lightly doped source/drain (LDD) regions 212C are formed in the respective doped wells (not shown) on two sides of each of the polysilicon gate electrode 240; and source/drain (S/D) regions 214C may be formed in the respective doped wells (not shown) between the isolation structures 204 and the spacers 210C.

Figure 4B:
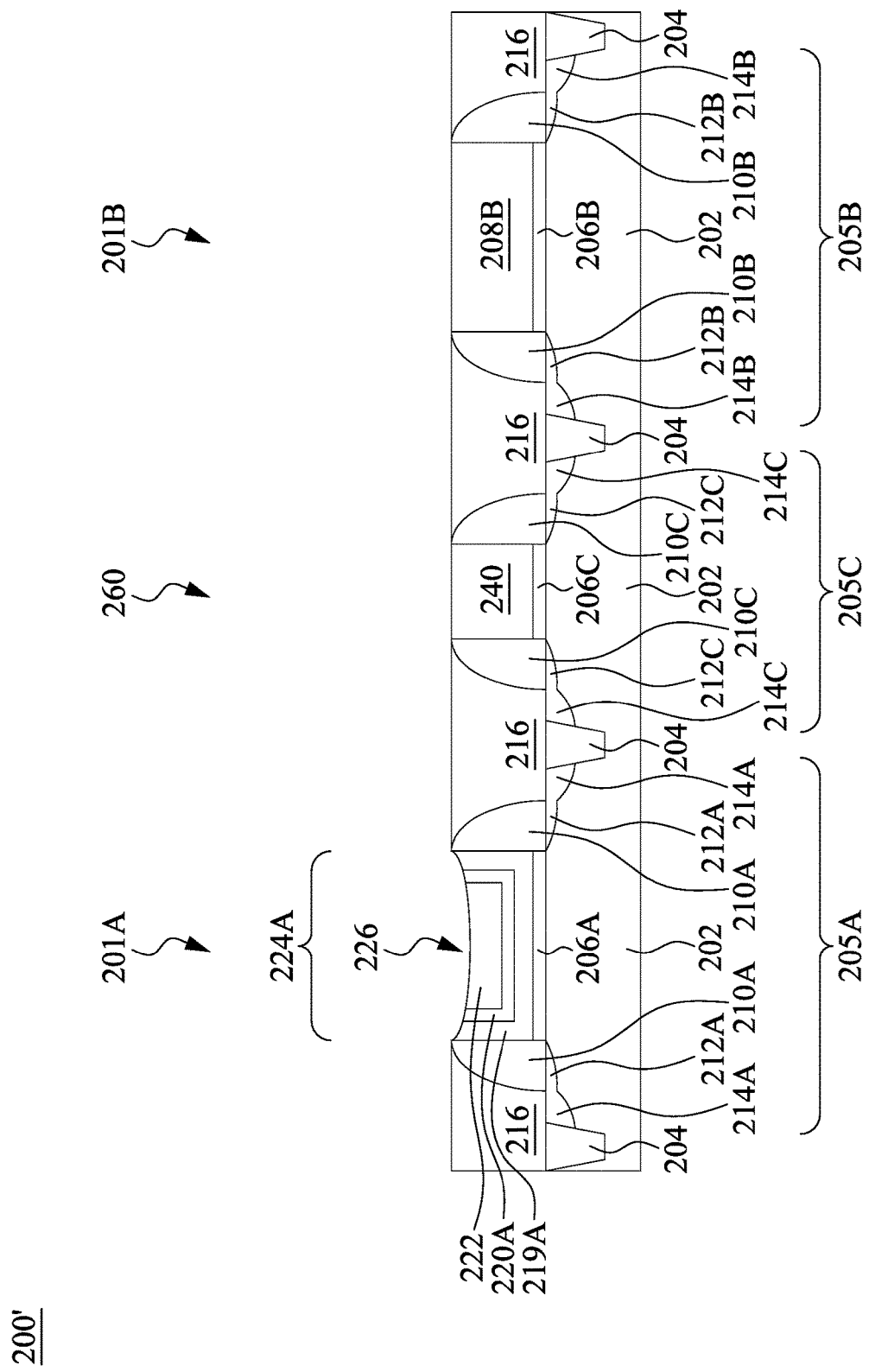

Referring to FIG. 4B, at blocks 304 to 308, the first sacrificial gate 208A has been replaced with a first metal gate structure 224A for use as a PMOS gate structure in the first/PMOS region 205A. In some embodiments, the first metal gate structure 224A is comprised of a first dielectric layer 206A, a first high-k gate dielectric layer 219A, a first work function layer 220A, and a first metallic material layer 222. In some embodiments, a recess 226 is formed over a top surface of the first metal gate structure 224A caused by dishing of gate structures during the CMP processes. In some embodiments, the semiconductor device 200' shown in FIG. 4B has similar configurations as described above or illustrated in any one of FIGS. 2A to 2D.

Figure 4C:
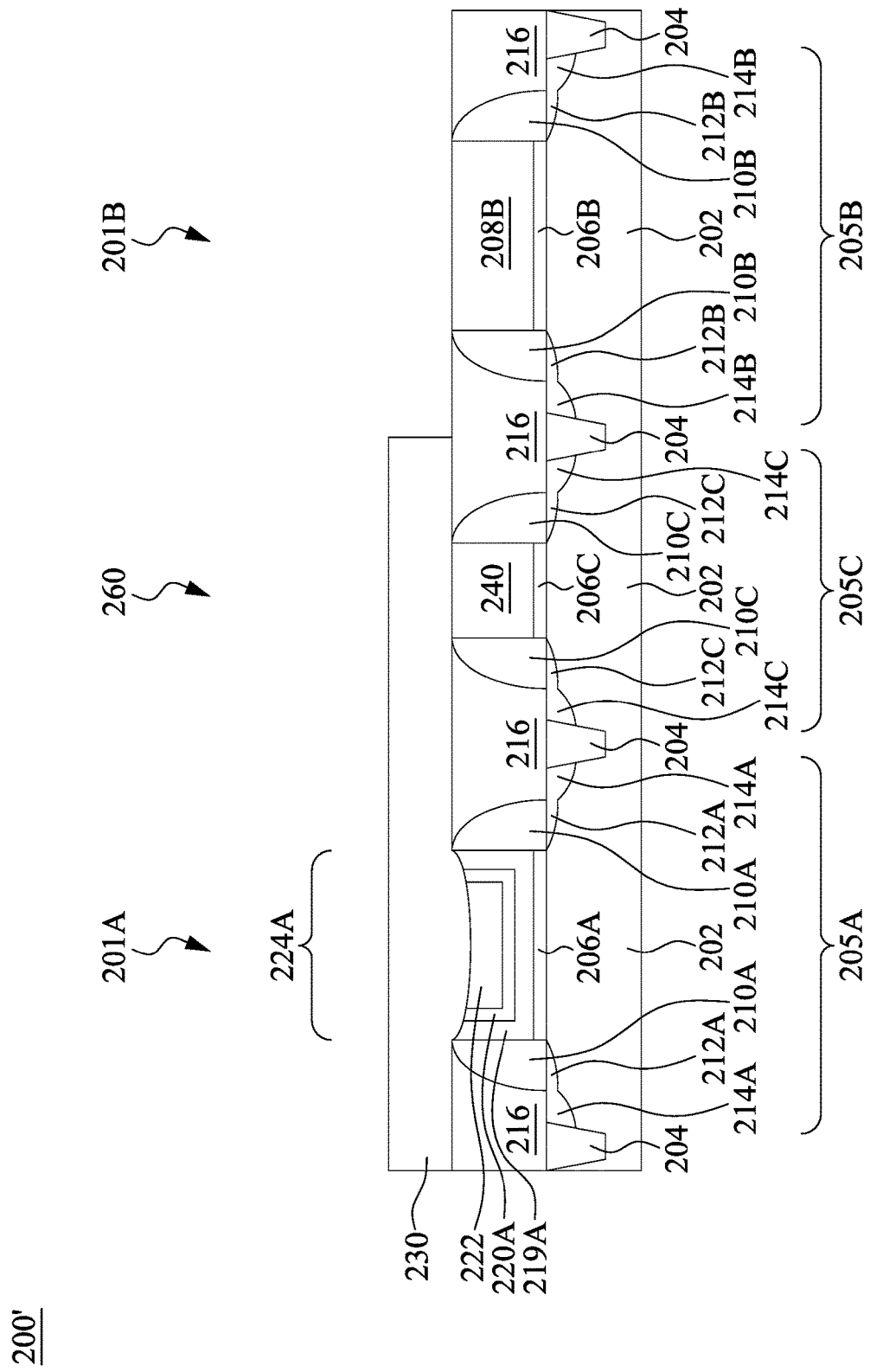

At blocks 310 to 318, a gate replacement process of replacing the second sacrificial gate with a second metal gate structure is performed. Referring to FIG. 4C, at block 310, a patterned dielectric layer, such as a patterned photoresist 230, may be deposited over the substrate 202 to at least cover the first region 205A and the third region 205C or to cover the PMOS transistor 201A and the high resistance polysilicon transistor 260. In some embodiments, the patterned photoresist layer 230 can fill in the recess 226 of the first metal gate structure 224A. In some embodiments, the recess 226 is filled with the patterned photoresist layer 230.

Figure 4D:
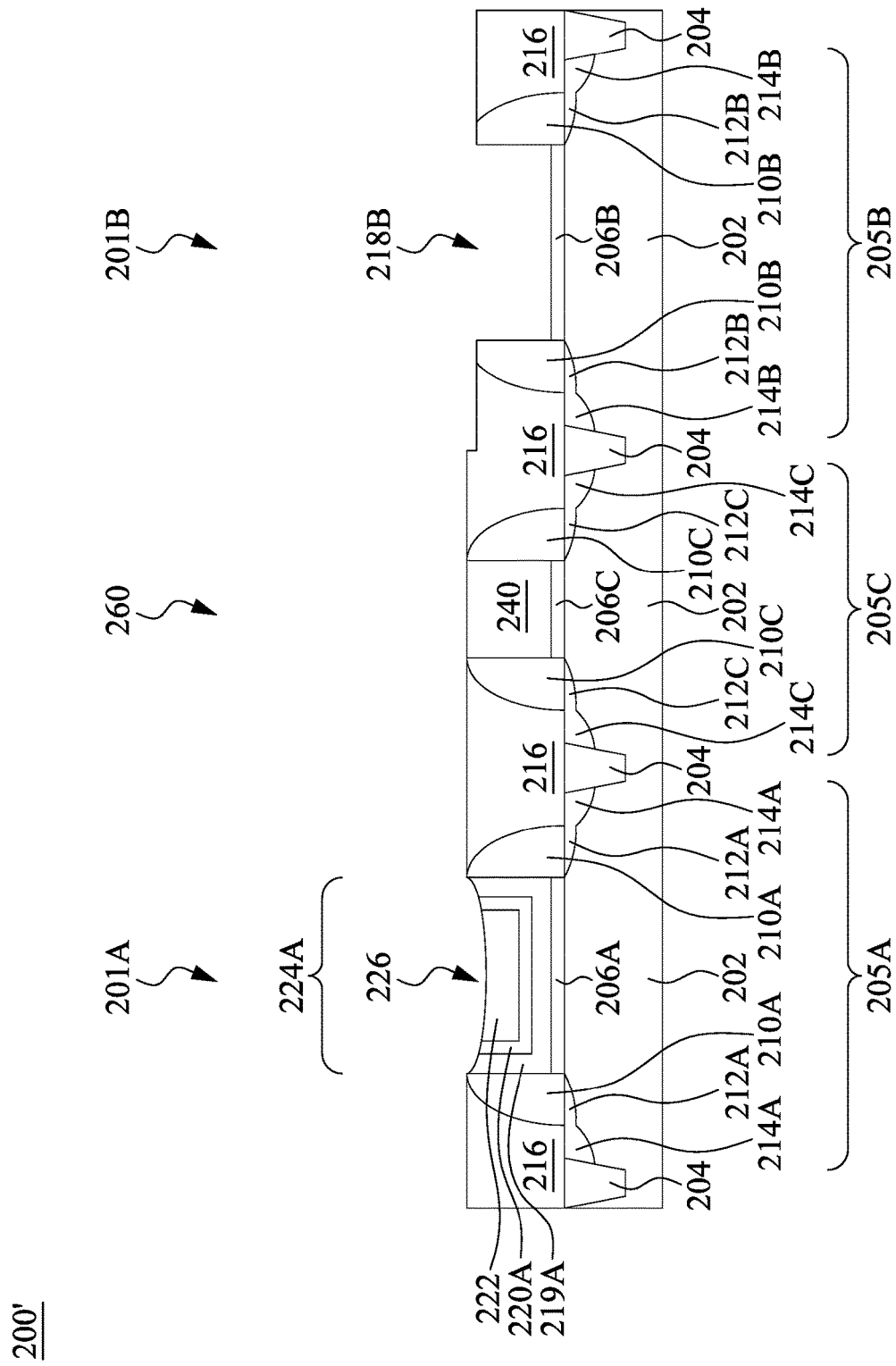

Referring to FIG. 4D, at blocks 312 to 314, the second sacrificial gate 208B not covered by the patterned photoresist layer 230 is removed to form a second trench 218B, and then the patterned photoresist layer 230 is removed. In some embodiments, a portion of the ILD layer 216 and the spacers 210B around the second sacrificial gate 208B may be removed. In some embodiments, the removed portion of the ILD layer 216 has a thickness ranging from about 60 Å to about 70 Å. In some embodiments, due to the protection of the patterned photoresist layer 230, recesses issue or loss in the ILD layer 216, the spacers 210A around the first metal gate structure 224A, and the spacers 210C around the polysilicon gate 240 can be mitigated. In some embodiments, the first metal gate structure 224A and the polysilicon gate 240 are well protected by the pattern photoresist layer 230. In some embodiments, removing the second sacrificial gate 208B comprises keeping the spacers 210A and the spacers 210C intact in the ILD layer 216.

Figure 4E:
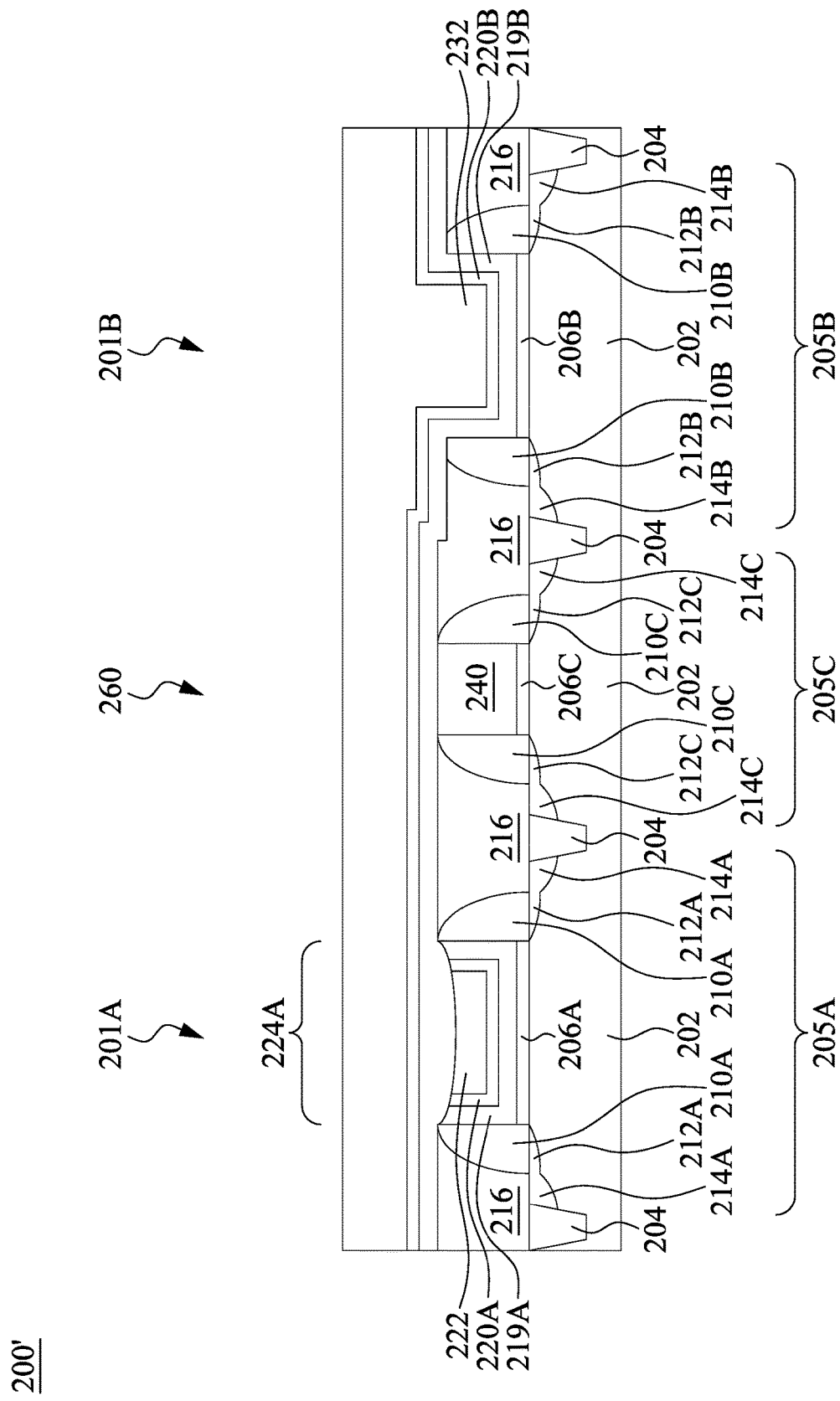
Figure 4F:
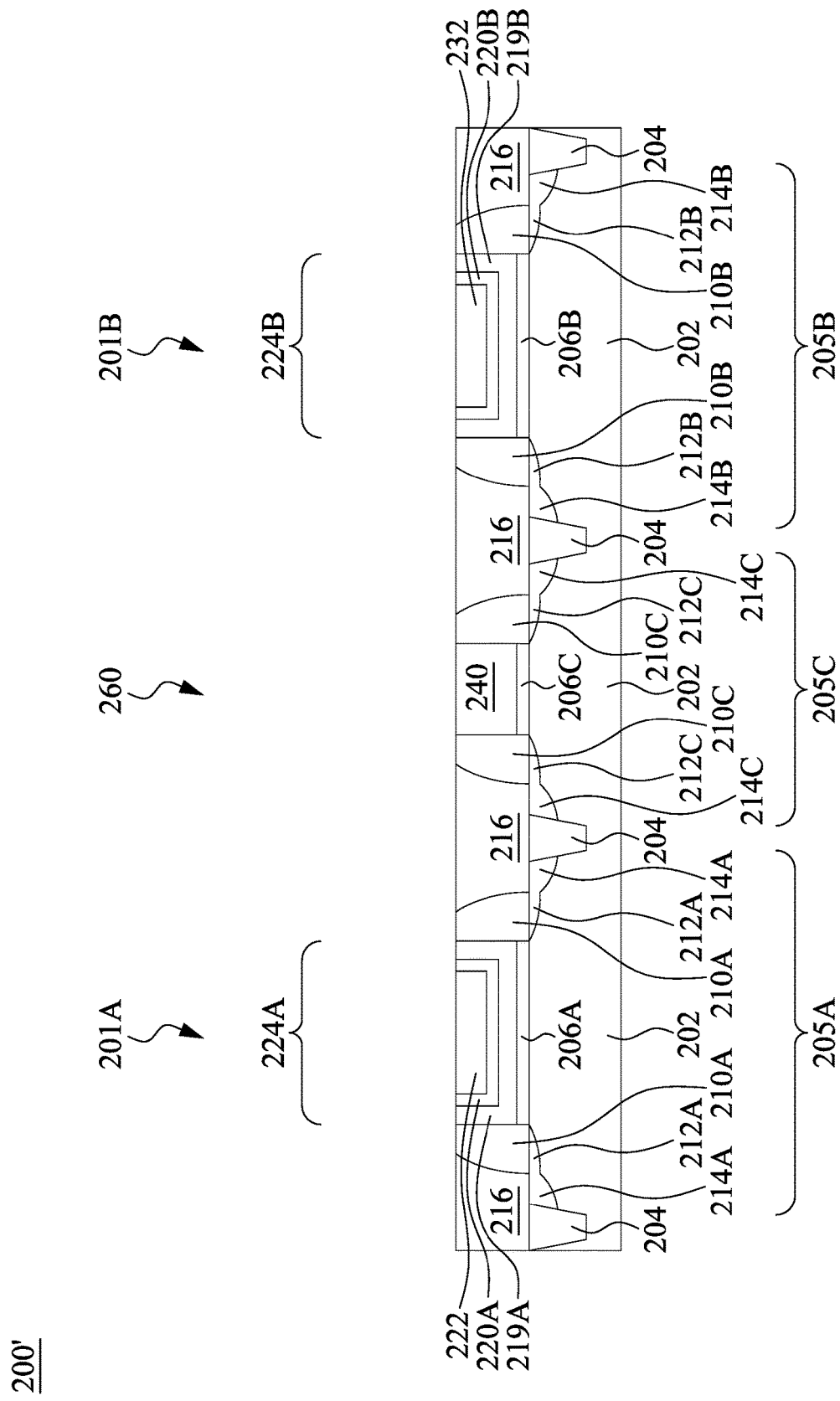

Then, referring to FIGS. 4E and 4F, at blocks 316 and 318, a second high-k gate dielectric layer 219B, a second work function layer 220B and a second metallic material layer 232 are sequentially deposited in the second trench 218B left by the removed second sacrificial gate 208B. Thereafter, a CMP is performed to planarize the surface of the substrate 202, and a remaining portion of the second high-k gate dielectric layer 219B, the second work function layer 220B and the second metallic material layer 232 forms a second metal gate structure 224B. In some embodiments, a top surface of the first metal gate structure 224A is substantially coplanar with a top surface of the second metal gate structure 224B and a top surface of the high-resistance polysilicon gate 240.

FIGS. 5A-5H are cross-sectional views of a sequential process of manufacturing a semiconductor device 200" during various manufacturing stages according to the method of FIG. 1 in accordance with some embodiments of the present disclosure. In FIGS. 5A-5H, like reference numerals will be given to like portions to those which have already been described above so as to omit the repetition of similar descriptions. In addition, portions about which no particular description will be made have the similar constructions to those of the semiconductor device 200 and 200' described above and provide the same or similar advantages provided thereby.

Figure 5A:
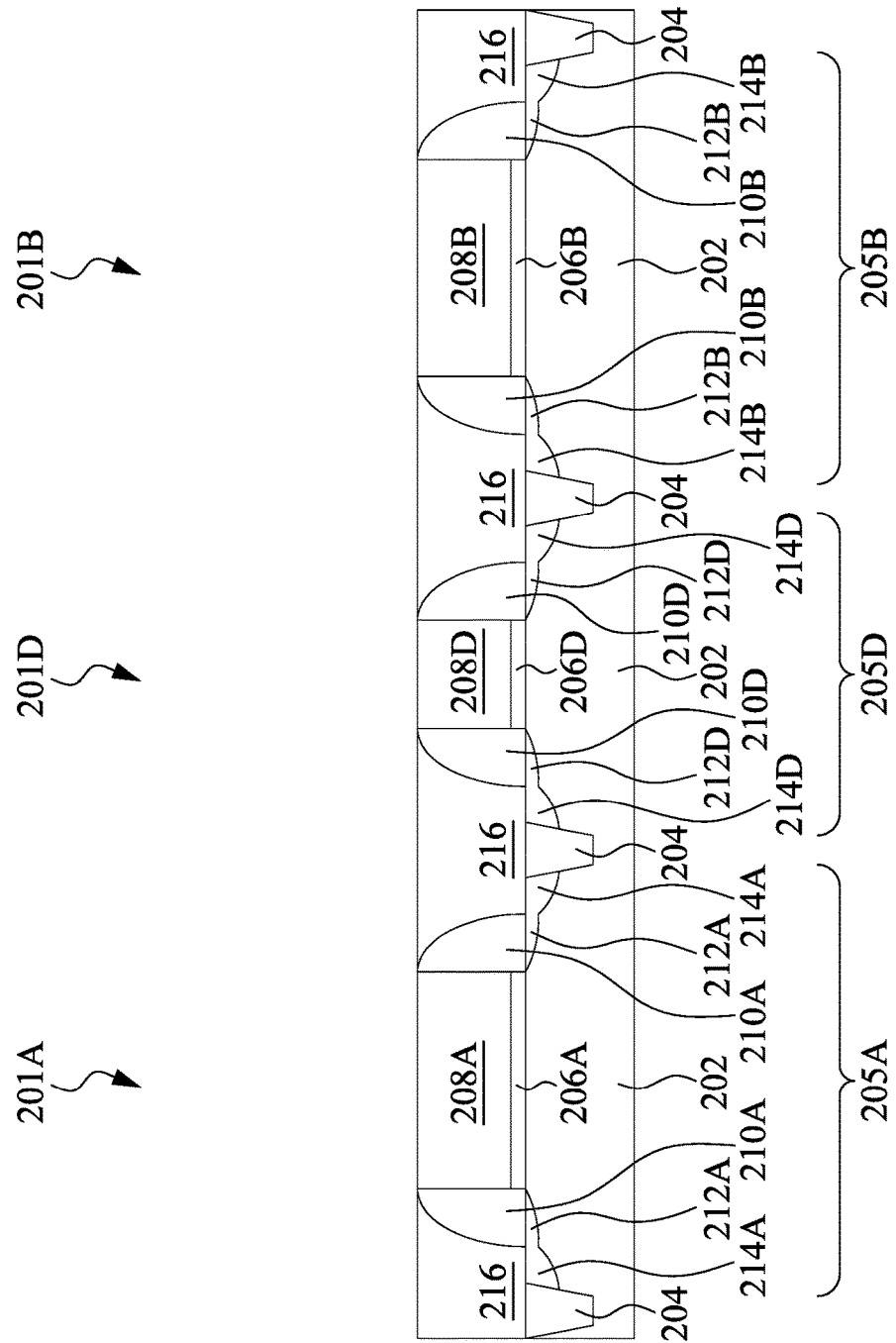

Referring to FIG. 5A, a substrate 202 having a first sacrificial gate 208A of a first transistor 201A, a second sacrificial gate 208B of a second transistor 201B, and a third sacrificial gate 208D of a third transistor 201D disposed thereon and spaced apart from each other by an interlayer dielectric layer 216 is provided or received. In some embodiments, the substrate 202 includes a first region 205A configured for accommodating the first transistor 201A, a second region 205B configured for accommodating the second transistor 201B, and a third region 205D configured for accommodating the third transistor 201D. In some embodiments, the first region 205A is a PMOS transistor region, the second region 205B is an NMOS transistor region, and the third region 205D is also a PMOS transistor region. It is understood that a plurality of gate structures or sacrificial gate structures or other components may be formed over the substrate 202 in the first region 205A, the second region 205B, and the third region 205D. In some embodiments, the third transistor 201D can be disposed between the first transistor 201A and the second transistor 201B, but the disclosure is not limited thereto. In some embodiments, gate lengths of the first sacrificial gates 208A and 208B are larger than a gate length of the third sacrificial gate 208D. In some embodiments, the first sacrificial gate 208A has a gate length of about 40 nm or more or about 1 μm or more, and the second sacrificial gate 208B has a gate length of about 40 nm or more or about 1 μm or more, but the disclosure is not limited thereto. In some embodiments, the third sacrificial gate 208D has a gate length of less than about 40 nm, or about 28 nm or less, or about 22 nm or less, but the disclosure is not limited thereto.

Figure 5B:
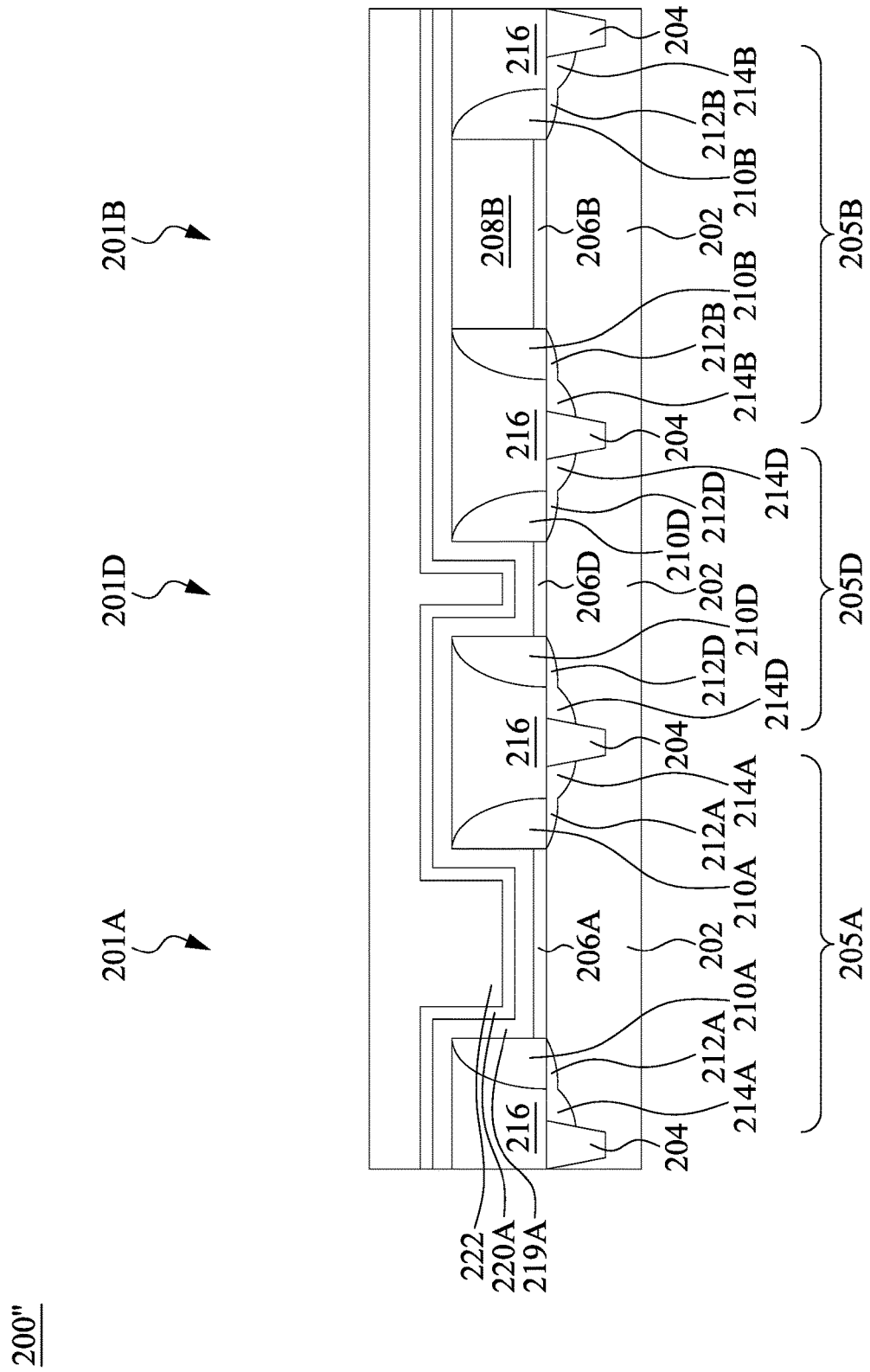
Figure 5C:
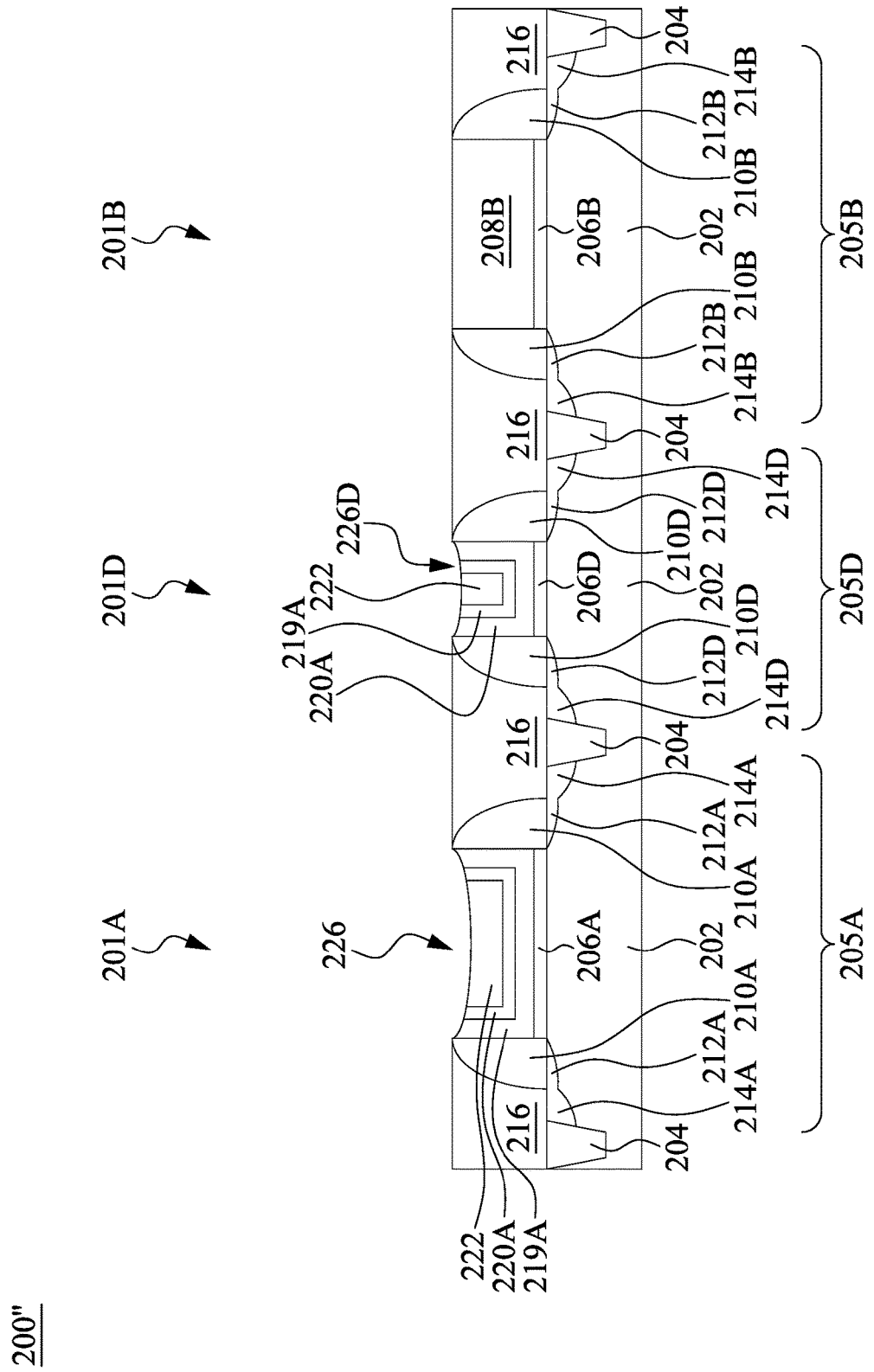
Figure 5D:
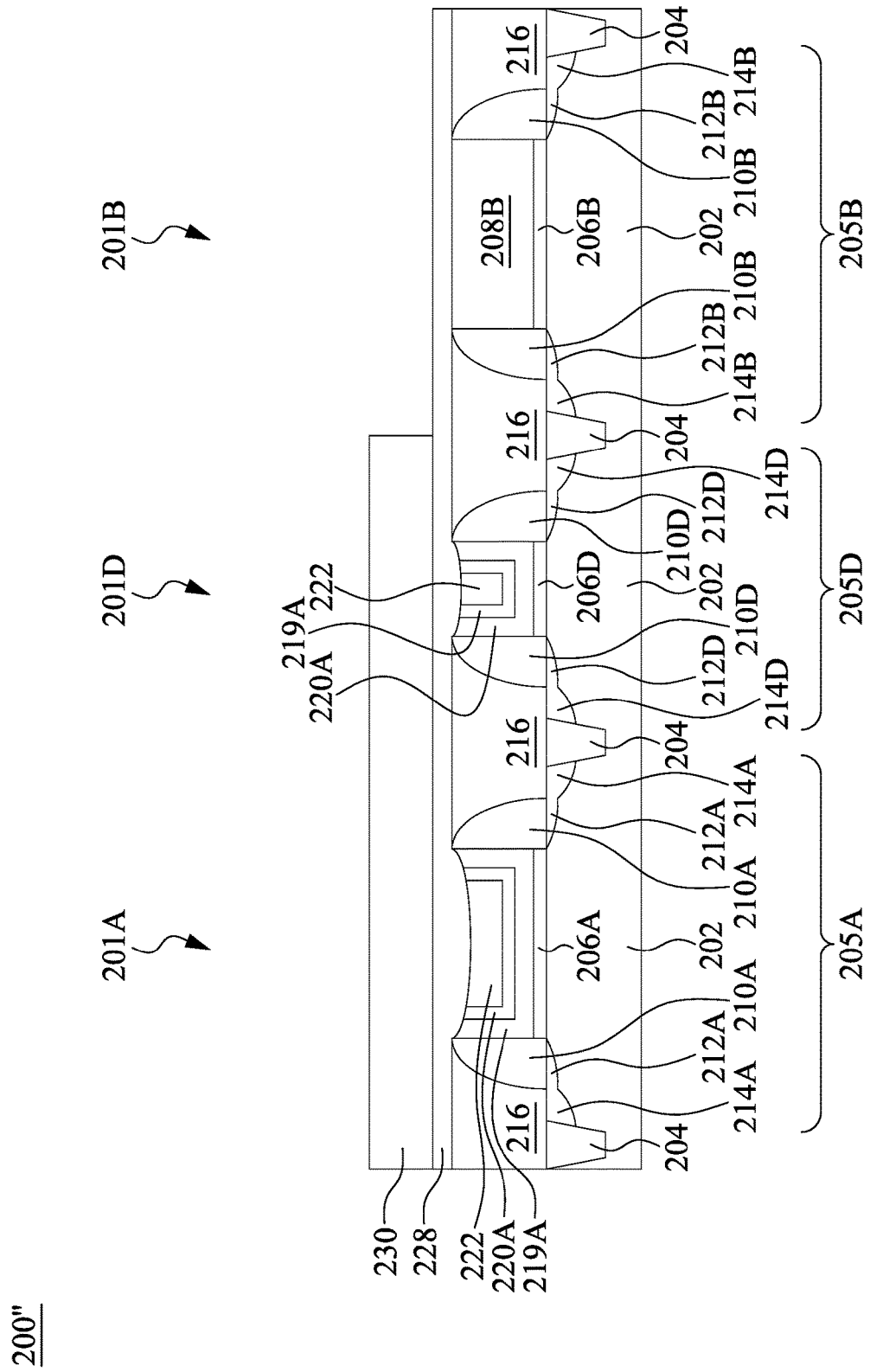
Figure 5E:
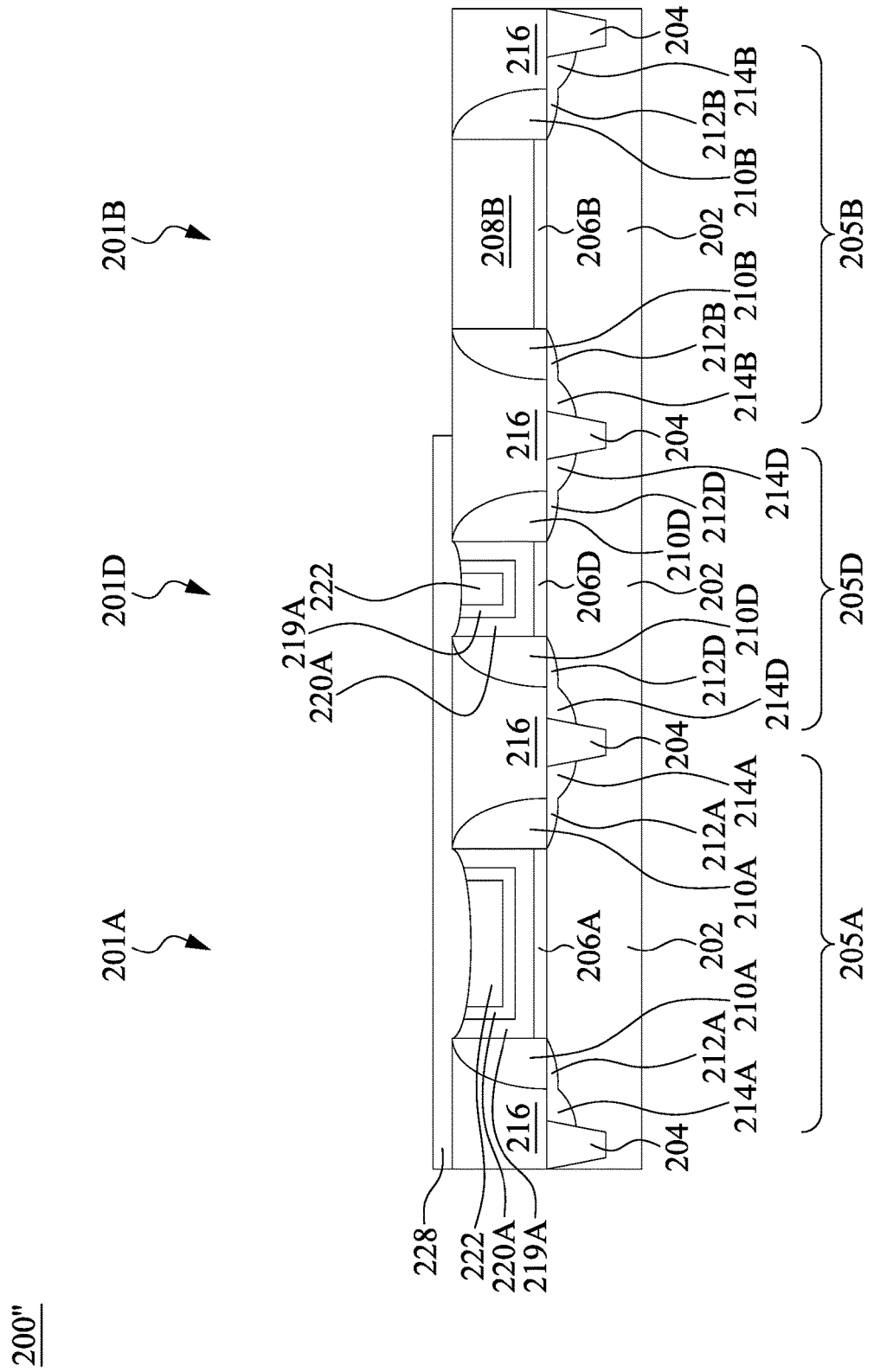
Figure 5F:
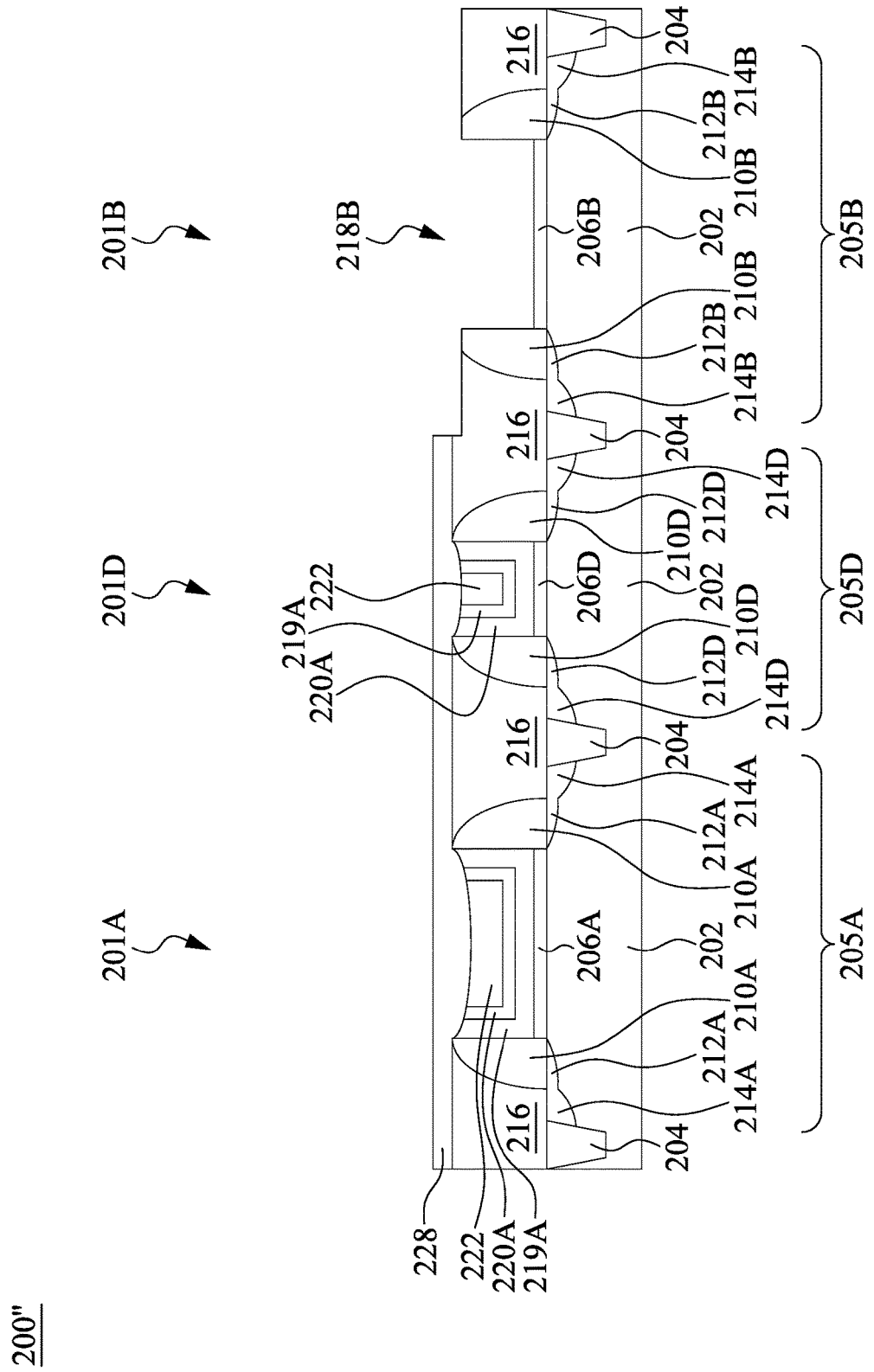
Figure 5G:
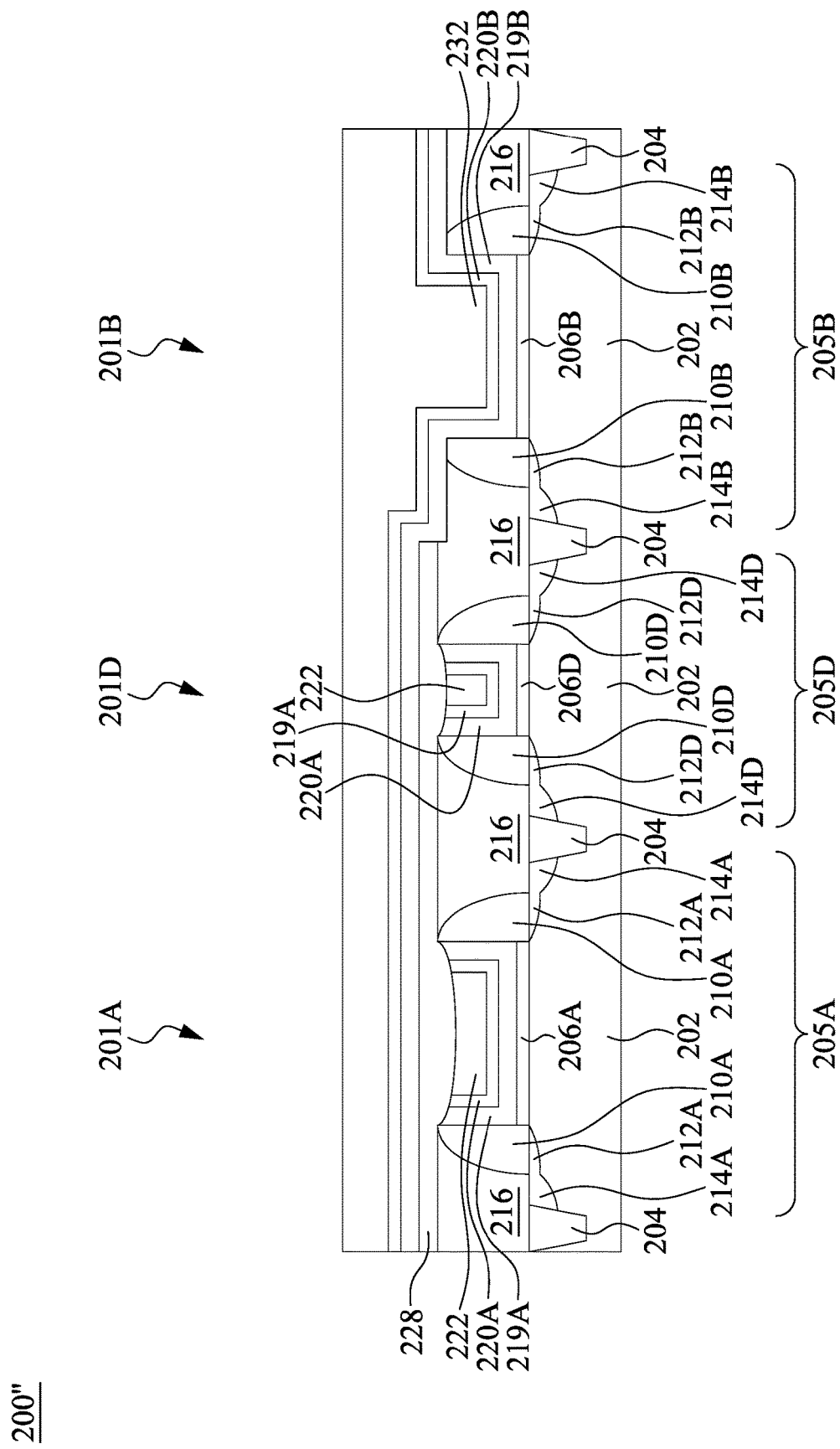

Referring to FIG. 5B, the first sacrificial gate 208A and the third sacrificial gate 208D are removed; then, a first high-k gate dielectric layer 219A, a first work function layer 220A, and a first metallic material layer 222 are sequentially formed in the trenches left by the removed first sacrificial gate 208A and the removed third sacrificial gate 208D. Referring to FIG. 5C, a first CMP process is performed to planarize the first metallic material layer 222, the first work function layer 220A, and the first high-k gate dielectric layer 219A until an upper surface of the ILD layer 216 is reached and exposed. As a result, a first metal gate structure 224A for the PMOS device comprising the dielectric layer 206A, the first high-k gate dielectric layer 219A, the first work function layer 220A, and the first metallic material layer 222 is formed. Also, a third metal gate structure 224D for the PMOS device comprising a dielectric layer 206D, the first high-k gate dielectric layer 219A, the first work function layer 220A, and the first metallic material layer 222 is formed. In some embodiments, a recess 226 is formed over a top surface of the first metal gate structure 224A caused by dishing of gate structures during the CMP processes. In some embodiments, a recess 226D is formed over a top surface of the third metal gate structure 224D. In some embodiments, the semiconductor device 200" shown in FIG. 5C has similar configurations as described above or illustrated in any one of FIGS. 2A to 2D. In some embodiments, the recess 226 has a depth larger than that of the recess 226D.

Figure 5H:
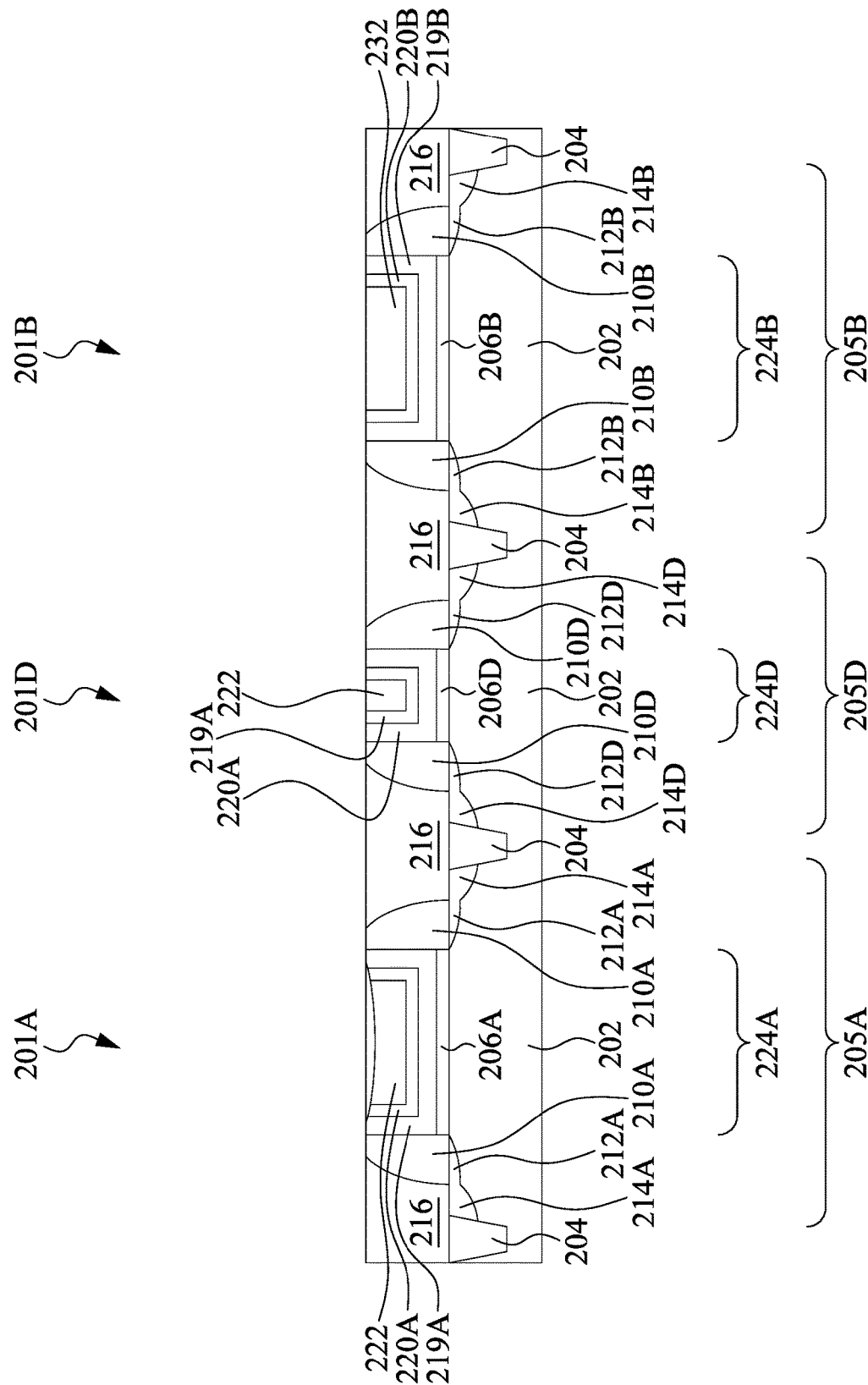

FIGS. 5D to 5H show the replacement of the second sacrificial gate 208B with a second metal gate structure 224B. Like reference numerals will be given to like portions to those which have already been described above so as to omit the repetition of similar descriptions. Referring to FIG. 5H, the semiconductor device 200" is formed. In some embodiments, a top surface of the first metal gate structure 224A is aligned with the top surface of the second metal gate structure 224B and the top surface of the third metal structure 224D. In some embodiments, the patterned dielectric layer 228 over the top surface of the first metal gate structure 224A has a thickness ranging from larger than about 0 to about 20 Å. In some embodiments, a top surface of the patterned dielectric layer 228 remaining on the first metal gate structure 224A is substantially coplanar with a top surface of the second metal gate structure 224B and a top surface of the third metal gate structure 224D.

In the present disclosure, methods to improve MG CMP gate height uniformity during twice MG CMP processes and semiconductor devices obtained therefrom are disclosed. The methods of the present disclosure can reduce dishing effect for gate structures during CMP of gate layers and thus improve gate height uniformity so as to minimize device mis-match characteristics. Large gate structures, such as analog devices, can greatly benefit from the reduction of dishing effect. For example, the gate height thickness of large devices can be improved from about 100~200 Å to about 0~80 Å. It is understood that different embodiments disclosed herein offer different disclosure, and that they may make various changes, substitutions and alterations herein without departing from the spirit and scope of the present disclosure.

In some embodiments, a method of manufacturing a semiconductor device comprises providing a substrate having a first sacrificial gate of a first transistor and a second sacrificial gate of a second transistor; removing the first sacrificial gate thereby forming a first trench; forming a first metal gate stack layer in the first trench; performing a first chemical mechanical polish (CMP) on the first metal gate stack layer to form a first metal gate structure of the first transistor, wherein a recess is formed over a top surface of the first metal gate structure; forming a patterned dielectric layer over the first metal gate structure, wherein the recess is filled with the patterned dielectric layer; removing the second sacrificial gate to form a second trench; forming a second metal gate stack layer in the second trench; and performing a second CMP on the second metal gate stack layer to form a second metal gate structure of the second transistor.

In some embodiments, a method of manufacturing a semiconductor device comprises providing a substrate having a first sacrificial gate of a first transistor and a second sacrificial gate of a second transistor; removing the first sacrificial gate thereby forming a first trench; forming a first metal gate stack layer in the first trench; performing a first chemical mechanical polish (CMP) on the first metal gate stack layer to form a first metal gate structure of the first transistor, and a first recess is formed over a top surface of the first metal gate structure; forming a patterned photoresist layer over the first metal gate structure, wherein the first recess is filled with the patterned photoresist layer; removing the second sacrificial gate not covered by the patterned photoresist layer thereby forming a second trench; removing the patterned photoresist layer; forming a second metal gate stack layer in a second trench; and performing a second CMP on the second metal gate stack layer to form a second metal gate structure of the second transistor.

In some embodiments, a semiconductor device comprises a substrate; a first metal gate structure of a first conductive type transistor disposed over the substrate; a dielectric layer over the first metal gate structure; a second metal gate structure of a second conductive type transistor disposed over the substrate; wherein the first conductive type and the second conductive type are complementary, and wherein a top surface of the dielectric layer is substantially coplanar with a top surface of the second metal gate structure.

In some embodiments, a method of manufacturing a semiconductor device comprises providing a substrate having a first sacrificial gate of a first transistor and a second sacrificial gate of a second transistor spaced apart from each other by an interlayer dielectric layer; removing the first sacrificial gate thereby forming a first trench; forming a first metal gate stack layer in the first trench; performing a first chemical mechanical polish (CMP) on the first metal gate stack layer to form a first metal gate structure of the first transistor, wherein a first recess is formed over a top surface of the first metal gate structure; forming a patterned dielectric layer over the first metal gate structure, wherein the first recess is fined with the patterned dielectric layer; removing the second sacrificial gate and a portion of the interlayer dielectric layer not covered by the patterned dielectric layer thereby forming a second trench; forming a second metal gate stack layer in the second trench; and performing a second CMP on the second metal gate stack layer to form a second metal gate structure of the second transistor.

In some embodiments, a method of manufacturing a semiconductor device comprises providing a substrate having a first sacrificial gate of a first transistor and a second sacrificial gate of a second transistor; removing the first sacrificial gate thereby forming a first trench; forming a first metal gate stack layer in the first trench; performing a first chemical mechanical polish (CMP) on the first metal gate stack layer to form a first metal gate structure of the first transistor, wherein a first recess is formed over a top surface of the first metal gate structure; forming a patterned dielectric layer over the first metal gate structure, wherein the first recess is filled with the patterned dielectric layer; removing the second sacrificial gate to form a second trench; forming a second metal gate stack layer in the second trench; and performing a second CMP on the second metal gate stack layer to form a second metal gate structure of the second transistor and to remove only a portion of the pattern dielectric layer 228 over the first metal gate structure.

In some embodiments, a semiconductor device comprises a substrate; a first metal gate structure of a first conductive type transistor disposed over the substrate; a dielectric layer over the first metal gate structure; a second metal gate structure of a second conductive type transistor disposed over the substrate; wherein the first conductive type and the second conductive type are complementary, and wherein a top surface of the dielectric layer is substantially coplanar with a top surface of the second metal gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   providing a substrate having a first sacrificial gate of a first transistor and a second sacrificial gate of a second transistor spaced apart from each other by an interlayer dielectric layer;
   removing the first sacrificial gate thereby forming a first trench;
   forming a first metal gate stack layer in the first trench;
   performing a first chemical mechanical polish (CMP) on the first metal gate stack layer to form a first metal gate structure of the first transistor, wherein a first recess is formed over a top surface of the first metal gate structure;
   forming a patterned dielectric layer over the first metal gate structure, wherein the first recess is filled with the patterned dielectric layer, and the patterned dielectric layer is in contact with the first metal gate structure;
   removing the second sacrificial gate and a portion of the interlayer dielectric layer not covered by the patterned dielectric layer thereby forming a second trench;
   forming a second metal gate stack layer in the second trench; and
   performing a second CMP on the second metal gate stack layer to form a second metal gate structure of the second transistor,
   wherein a top surface of the patterned dielectric layer on the first metal gate structure is substantially coplanar with a top surface of the second metal gate structure.

2. The method of claim 1, wherein the first transistor has a first conductive type, the second transistor has a second conductive type, and the first conductive type and the second conductive type are complementary.

3. The method of claim 1, further comprising a polysilicon gate disposed over the substrate.

4. The method of claim 3, wherein the polysilicon gate serves as a third sacrificial gate of a third transistor or serves as a high-resistance resistor.

5. The method of claim 3, wherein the polysilicon gate is covered by the patterned dielectric layer before the second CMP.

6. The method of claim 5, wherein a top surface of the polysilicon gate is aligned with the top surface of the second metal gate structure after the second CMP.

7. The method of claim 3, further comprising:
   removing the polysilicon gate to form a third trench;
   forming a third metal gate stack layer in the third trench; and
   performing the first CMP on the third metal gate stack layer to form a third metal gate structure of the third transistor.

8. The method of claim 1, wherein the patterned dielectric layer is selected from the group consisting of silicon oxide, silicon nitride, silicon oxynitride, spin-on glass (SOG), fluorinated silica glass (FSG), polyimide and combinations thereof.

9. The method of claim 1, wherein the forming of the first metal gate structure further comprises:
   depositing a first high-k gate dielectric layer in the first trench;
   depositing a first work function layer over the first high-k gate dielectric layer; and
   depositing a first metallic material layer over the first work function layer,
   wherein the first work function layer lines sidewalls and a bottom of the first trench without filling up the first trench.

10. The method of claim 1, wherein the forming of the second metal gate structure further comprises:
    depositing a second high-k gate dielectric layer in the first trench;
    depositing a second work function layer over the second high-k gate dielectric layer; and
    depositing a second metallic material layer over the second work function layer,
    wherein the second work function layer lines sidewalls and a bottom of the second trench without filling up the second trench.

11. The method of claim 1, wherein a spacer is formed on each side of the second sacrificial gate.

12. The method of claim 11, wherein removing the second sacrificial gate and a portion of the interlayer dielectric layer further comprises removing a portion of the spacer not covered by the patterned dielectric layer.

13. A method of manufacturing a semiconductor device, comprising:
    providing a substrate having a first sacrificial gate of a first transistor and a second sacrificial gate of a second transistor;
    removing the first sacrificial gate thereby forming a first trench;
    forming a first metal gate stack layer in the first trench;
    performing a first chemical mechanical polish (CMP) on the first metal gate stack layer to form a first metal gate structure of the first transistor, wherein a first recess is formed over a top surface of the first metal gate structure;
    forming a patterned dielectric layer over the first metal gate structure, wherein the first recess is filled with the patterned dielectric layer, and the patterned dielectric layer is in contact with the first metal gate structure;
    removing the second sacrificial gate to form a second trench;
    forming a second metal gate stack layer in the second trench; and
    performing a second CMP on the second metal gate stack layer to form a second metal gate structure of the second transistor and to remove only a portion of the pattern dielectric layer over the first metal gate structure,
    wherein a top surface of the patterned dielectric layer on the first metal gate structure is substantially coplanar with a top surface of the second metal gate structure.

14. The method of claim 13, further comprising a polysilicon gate disposed over the substrate, wherein the polysilicon gate serves as a third sacrificial gate of a third transistor or serves as a high-resistance resistor.

15. The method of claim 14, wherein the polysilicon gate is covered by the patterned dielectric layer.

16. The method of claim 15, wherein a top surface of the polysilicon gate is aligned with the top surface of the second metal gate structure after the second CMP.

17. The method of claim 14, further comprising:
    removing the polysilicon gate to form a third trench;
    forming a third metal gate stack layer in the third trench;
    performing the first CMP on the third metal gate stack layer to form a third metal gate structure of the third transistor, wherein a second recess is formed over a top surface of the third metal gate structure, and a depth of the second recess is less than a depth of the first recess; and forming the patterned dielectric layer over the third metal gate structure, wherein the second recess is filled with the patterned dielectric layer.

18. The method of claim 17, wherein the top surface of the third metal gate structure is aligned with the top surface of the second metal gate structure after the second CMP.

19. A method of manufacturing a semiconductor device, comprising:

providing a substrate having a first sacrificial gate of a first transistor and a second sacrificial gate of a second transistor spaced apart from each other by an interlayer dielectric layer, a first dielectric layer being formed between the substrate and the first sacrificial gate and a second dielectric layer being formed between the substrate and the second sacrificial gate;

removing the first sacrificial gate thereby forming a first trench;

forming a first metal gate stack layer in the first trench, the first metal gate stack layer being in contact with the first dielectric layer;

performing a first chemical mechanical polish (CMP) on the first metal gate stack layer to form a first metal gate structure of the first transistor, wherein a first recess is formed over a top surface of the first metal gate structure;

forming a patterned dielectric layer over the first metal gate structure, wherein the first recess is filled with the patterned dielectric layer, and the patterned dielectric layer is in contact with the first metal gate structure;

removing the second sacrificial gate and a portion of the interlayer dielectric layer not covered by the patterned dielectric layer thereby forming a second trench;

forming a second metal gate stack layer in the second trench, the second metal gate stack layer being in contact with the second dielectric layer; and performing a second CMP on the second metal gate stack layer to form a second metal gate structure of the second transistor, wherein a top surface of the patterned dielectric layer on the first metal gate structure is substantially coplanar with a top surface of the second metal gate structure.

20. The method of claim 19, wherein the patterned dielectric layer is selected from the group consisting of silicon oxide, silicon nitride, silicon oxynitride, spin-on glass (SOG), fluorinated silica glass (FSG), polyimide and combinations thereof.

* * * * *